(12) United States Patent
Hill

(10) Patent No.: US 6,762,845 B2
(45) Date of Patent: Jul. 13, 2004

(54) MULTIPLE-PASS INTERFEROMETRY

(75) Inventor: Henry A. Hill, Tucson, AZ (US)

(73) Assignee: Zygo Corporation, Middlefield, CT (US)

( * ) Notice: Subject to any disclaimer, the term of this patent is extended or adjusted under 35 U.S.C. 154(b) by 11 days.

(21) Appl. No.: 10/227,167

(22) Filed: Aug. 23, 2002

(65) Prior Publication Data

US 2003/0048456 A1 Mar. 13, 2003

Related U.S. Application Data

(60) Provisional application No. 60/314,568, filed on Aug. 23, 2001.

(51) Int. Cl.[7] .................................................. G07B 9/02
(52) U.S. Cl. ........................ 356/520; 356/500; 356/509
(58) Field of Search ................................ 356/520, 509, 356/510, 508, 500, 498, 493, 486, 482

(56) References Cited

U.S. PATENT DOCUMENTS

| | | | |
|---|---|---|---|
| 4,784,490 A | 11/1988 | Wayne | |
| 4,802,765 A | 2/1989 | Young et al. | |
| 4,881,815 A | 11/1989 | Sommargren | |
| 4,881,816 A | 11/1989 | Zanoni | |
| 4,883,357 A | 11/1989 | Zanoni et al. | |
| 5,064,289 A | 11/1991 | Bockman | |
| 5,483,343 A | 1/1996 | Iwamoto et al. | |
| 5,757,160 A | 5/1998 | Kreuzer | |
| 5,801,832 A | 9/1998 | Van Den Brink | |
| 6,020,964 A | 2/2000 | Loopstra et al. | |
| 6,046,792 A | 4/2000 | Van Der Werf et al. | |
| 6,252,667 B1 | 6/2001 | Hill et al. | |
| 6,271,923 B1 | 8/2001 | Hill | |
| 6,313,918 B1 * | 11/2001 | Hill | 356/498 |
| 6,552,804 B2 | 4/2003 | Hill | |
| 2002/0001087 A1 | 1/2002 | Hill | |

* cited by examiner

Primary Examiner—Samuel A. Turner
Assistant Examiner—Patrick Connolly
(74) Attorney, Agent, or Firm—Fish & Richardson P.C.

(57) ABSTRACT

Interferometry system including a multiple-pass interferometer having reflectors to reflect at least two beams along multiple passes through the interferometer, the multiple passes including a first set of passes and a second set of passes, the reflectors having first alignments that are normal to the directions of the paths of the beams that are reflected by the reflectors, the paths of the beams being sheared during the first set of passes and during the second set of passes if at least one of the reflectors has an alignment other than the first alignment, and optics to redirect the beams after the first set of passes and before the second set of passes so that shear imparted during the second set of passes cancels shear imparted during the first set of passes.

70 Claims, 16 Drawing Sheets

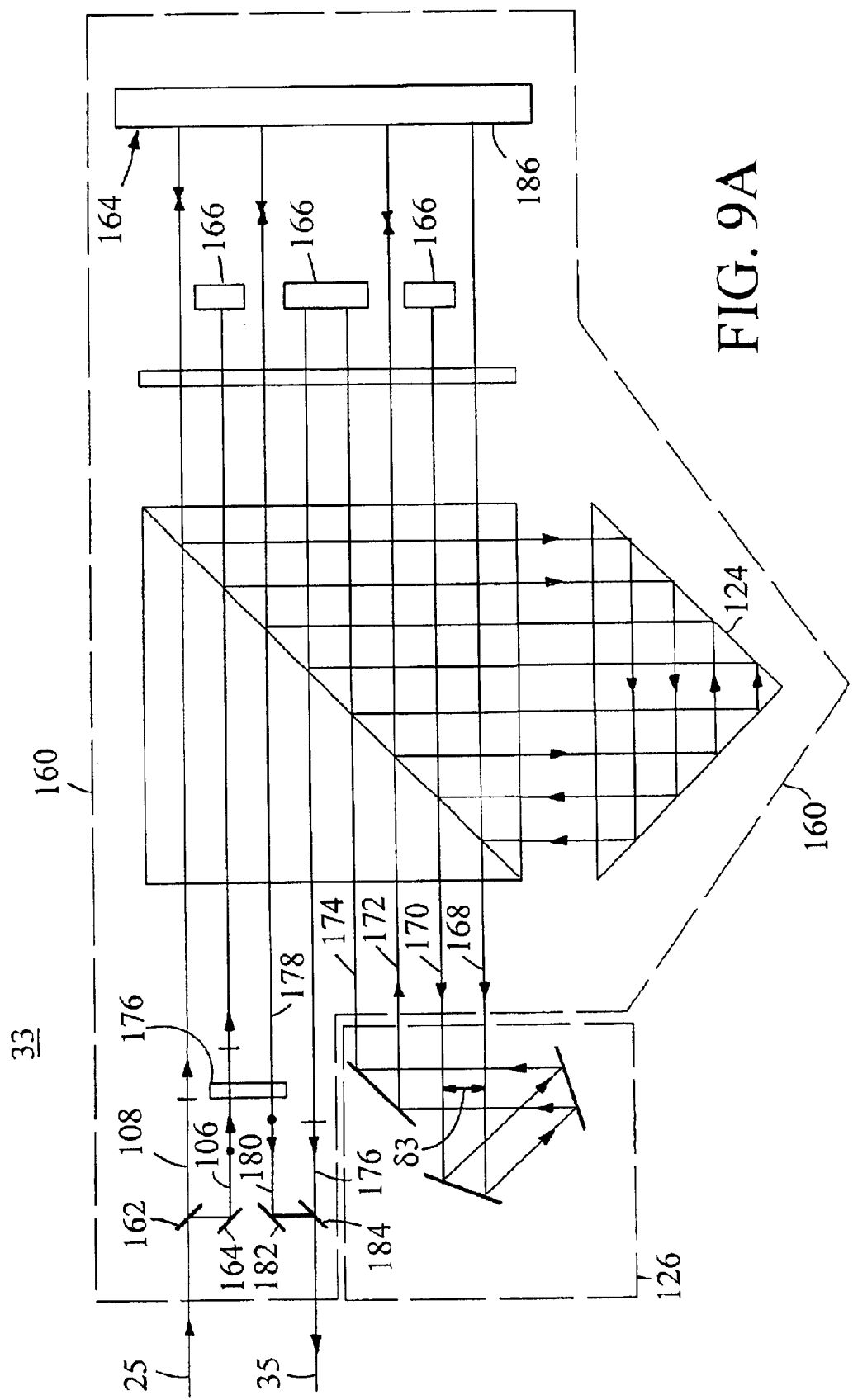

MULTIPLE-PASS INTERFEROMETRY

This application claims the benefit of U.S. Provisional Patent Application 60/314,568, filed on Aug. 23, 2001, entitled "ZERO SHEAR PLANE MIRROR INTERFEROMETER," to Henry A. Hill, the contents of which are incorporated by reference.

TECHNICAL FIELD

This description relates to multiple-pass interferometry.

BACKGROUND

Displacement measuring interferometers monitor changes in the position of a measurement object relative to a reference object based on an optical interference signal. The interferometer generates the optical interference signal by overlapping and interfering a measurement beam reflected from the measurement object with a reference beam reflected from the reference object.

Referring to FIG. 1, a typical interferometry system 10 includes a source 20, an interferometer 30, a detector 40, and an analyzer 50. Source 20 includes a laser for providing an input beam 25 to interferometer 30. In one example where heterodyne interferometry technique is used, input beam 25 includes two different frequency components having orthogonal polarizations. An acousto-optical modulator may be used to introduce frequency splitting to produce the two frequency components. Alternatively, source 25 may include a Zeeman-split laser to produce the frequency splitting. In another example, where homodyne interferometry technique is used, input beam 25 may have a single wavelength.

In a heterodyne interferometry system, the orthogonally polarized components are sent to interferometer 30, where they are separated into measurement and reference beams. The reference beam travels along a reference path. The measurement beam travels along a measurement path. The reference and measurement beams are later combined to form an overlapping pair of exit beams 35. The interference between the overlapping pair of exit beams contains information about the relative difference in optical path length between the reference and measurement paths. In a homodyne interferometry system, a non-polarizing beam splitter may be used to separate the input beam into the measurement and reference beams.

In one example, the reference path is fixed and the changes in the optical path length difference correspond to changes in the optical path length of the measurement path. In another example, the optical path length of both the reference and measurement paths may change, e.g., the reference path may contact a reference object that may move relative to interferometer 30. In this case, changes in the optical path length difference correspond to changes in the position of the measurement object relative to the reference object.

When the reference and measurement beams have orthogonal polarizations, the intensity of at least one intermediate polarization of the overlapping pair of exit beams is selected to produce the optical interference. For example, a polarizer may be positioned within interferometer 30 to mix the polarizations of the overlapping pair of exit beams, which is then sent to detector 40. Alternatively, the polarizer may be positioned within detector 40.

Detector 40 measures the intensity of the selected polarization of the overlapping pair of exit beams to produce the interference signal. Detector 40 includes a photodetector that measures the intensity of the selected polarization of the overlapping pair of exit beams. Detector 40 may also include electronic components (e.g., an amplifier and an analog-to-digital converter) that amplifies the output from the photodetector and produces a digital signal corresponding to the optical interference.

In many applications, the measurement and reference beams have orthogonal polarizations and different frequencies. The different frequencies can be produced, for example, by laser Zeeman splitting, by acousto-optical modulation, or internal to the laser using birefringent elements or the like. The orthogonal polarizations allow a polarizing beam splitter to direct the measurement and reference beams to the measurement and reference objects, respectively, and combine the reflected measurement and reference beams to form overlapping exit measurement and reference beams. The overlapping exit beams form an output beam that subsequently passes through a polarizer.

The polarizer mixes polarizations of the exit measurement and reference beams to form a mixed beam. Components of the exit measurement and reference beams in the mixed beam interfere with one another so that the intensity of the mixed beam varies with the relative phase of the exit measurement and reference beams. A detector measures the time-dependent intensity of the mixed beam and generates an electrical interference signal proportional to that intensity. Because the measurement and reference beams have different frequencies, the electrical interference signal includes a "heterodyne" signal having a beat frequency equal to the difference between the frequencies of the exit measurement and reference beams.

If the lengths of the measurement and reference paths are changing relative to one another, e.g., by translating a stage that includes the measurement object, the measured beat frequency includes a Doppler shift equal to $2vnp/\lambda$, where v is the relative speed of the measurement and reference objects, $\lambda$ is the wavelength of the measurement and reference beams, n is the refractive index of the medium through which the light beams travel, e.g., air or vacuum, and p is the number of passes to the reference and measurement objects. Changes in the relative position of the measurement object correspond to changes in the phase of the measured interference signal, with a $2\pi$ phase change substantially equal to a distance change L of $\lambda/(np)$, where L is a round-trip distance change, e.g., the change in distance to and from a stage that includes the measurement object.

Unfortunately, this equality is not always exact. In addition, the amplitude of the measured interference signal may be variable. A variable amplitude may subsequently reduce the accuracy of measured phase changes. Many interferometers include non-linearities such as what are known as "cyclic errors." The cyclic errors can be expressed as contributions to the phase and/or the intensity of the measured interference signal and have a sinusoidal dependence on the change in optical path length pnL. In particular, the first harmonic cyclic error in phase has a sinusoidal dependence on $(2\pi pnL)/\lambda$ and the second harmonic cyclic error in phase has a sinusoidal dependence on $2(2\pi pnL)/\lambda$. Higher harmonic cyclic errors can also be present.

There are also "non-cyclic non-linearities" such as those caused by a change in lateral displacement (i.e., "beam shear") between the reference and measurement beam components of an output beam of an interferometer when the wavefronts of the reference and measurement beam components have wavefront errors. This can be explained as follows.

Inhomogeneities in the interferometer optics may cause wavefront errors in the reference and measurement beams. When the reference and measurement beams propagate collinearly with one another through such inhomogeneities, the resulting wavefront errors are identical and their contributions to the interferometric signal cancel each other. More typically, however, the reference and measurement beam components of the output beam are laterally displaced from one another, i.e., they have a relative beam shear. Such beam shear causes the wavefront errors to contribute an error to the interferometric signal derived from the output beam.

Moreover, in many interferometry systems beam shear changes as the position or angular orientation of the measurement object changes. For example, a change in relative beam shear can be introduced by a change in the angular orientation of a plane mirror measurement object. Accordingly, a change in the angular orientation of the measurement object produces a corresponding error in the interferometric signal.

The effect of the beam shear and wavefront errors will depend upon procedures used to mix components of the output beam with respect to component polarization states and to detect the mixed output beam to generate an electrical interference signal. The mixed output beam may for example be detected by a detector without any focusing of the mixed beam onto the detector, by detecting the mixed output beam as a beam focused onto a detector, or by launching the mixed output beam into a single mode or multi-mode optical fiber and detecting a portion of the mixed output beam that is transmitted by the optical fiber. The effect of the beam shear and wavefront errors will also depend on properties of a beam stop should a beam stop be used in the procedure to detect the mixed output beam. Generally, the errors in the interferometric signal are compounded when an optical fiber is used to transmit the mixed output beam to the detector.

Amplitude variability of the measured interference signal can be the net result of a number of mechanisms. One mechanism is a relative beam shear of the reference and measurement components of the output beam that is for example a consequence of a change in orientation of the measurement object.

In dispersion measuring applications, optical path length measurements are made at multiple wavelengths, e.g., 532 nm and 1064 nm, and are used to measure dispersion of a gas in the measurement path of the distance measuring interferometer. The dispersion measurement can be used in converting the optical path length measured by a distance measuring interferometer into a physical length. Such a conversion can be important since changes in the measured optical path length can be caused by gas turbulence and/or by a change in the average density of the gas in the measurement arm even though the physical distance to the measurement object is unchanged.

SUMMARY

In general, in one aspect, the invention is directed towards an interferometry system that includes a multiple-pass interferometer having reflectors to reflect at least two beams along multiple passes through the interferometer, the multiple passes including a first set of passes and a second set of passes, the reflectors having first alignments that are normal to the directions of the paths of the beams that are reflected by the reflectors, the paths of the beams being sheared during the first set of passes and during the second set of passes if at least one of the reflectors has an alignment other than the first alignment, and optics to redirect the beams after the first set of passes and before the second set of passes so that shear imparted during the second set of passes cancels shear imparted during the first set of passes.

Implementations of the invention may include one or more of the following features. The optics are configured to redirect the beams while maintaining the magnitude and direction of shear between or among the beams. The propagation path of one of the beams after being redirected by the optics is parallel to the propagation path of the beam after completing the first set of passes. The reflectors comprise plane reflection surfaces. The beams include a reference beam that is directed toward one of the reflectors maintained at a position that is stationary relative to the interferometer. The beams include a measurement beam that is directed towards one of the reflectors that is movable relative to the interferometer.

Implementations of the invention may further include one or more of the following features. The paths of the reference and measurement beams define an optical path length difference, the changes in the optical path length difference indicative of changes in the position of the one of the reflectors that is movable relative to the interferometer. The reflectors include a first reflector and a second reflector, the beams including a first beam directed toward the first reflector and a second beam directed toward the second reflector, each of the first and second reflectors being movable relative to the interferometer. The paths of the first and second beams define an optical path length difference, the changes in the optical path length difference indicative of changes in relative positions of the first and second reflectors.

Implementations of the invention may further include one or more of the following features. The first set of passes consists of two passes, and during each pass each of the beams is reflected by one of the reflectors at least once. The second set of passes consists of two passes, and during each pass each of the beams is reflected by one of the reflectors at least once. The multiple-pass interferometer includes a beam splitter that separates an input beam into the beams and directs the beams toward the reflectors. The beam splitter includes a polarizing beam splitter. The optics consist of one reflection surface or include an odd number of reflection surfaces. For each beam redirected by the optics, the beam is reflected by the plane mirrors such that a sum of angles between incident and reflection beams of the plane mirrors is zero or an integer multiple of 360 degrees, the angle measured in a direction from the incident beam to the reflection beam, the angle having a positive value when measured in a counter clockwise direction and a negative value when measured in a clockwise direction.

Implementations of the invention may further include one or more of the following features. The interferometer combines the beams after the beams travel through the first and second set of passes to form overlapping beams that exit the interferometer. The apparatus further includes a detector that responds to optical interference between the overlapping beams and produces an interference signal indicative of an optical path length difference between the paths of the beams. The detector includes a photodetector, an amplifier, and an analog-to-digital converter. The apparatus further includes an analyzer coupled to the detector to estimate a change in an optical path length difference of the beams based on the interference signal. The apparatus further includes a source to provide the beams. The two beams have different frequencies.

In general, in another aspect, the invention is directed towards a lithography system for use in fabricating integrated circuits on a wafer. The system includes a stage to support the wafer, an illumination system to image spatially patterned radiation onto the wafer, a positioning system to adjust the position of the stage relative to the imaged radiation, and at least one of the interferometry system described above. The interferometry system measures the position of the stage.

In general, in another aspect, the invention is directed towards a lithography system for use in fabricating integrated circuits on a wafer. The system includes a stage to support the wafer, an illumination system including a radiation source, a mask, a positioning system, a lens assembly, and at least one of the interferometry system described above. During operation, the source directs radiation through the mask to produce spatially patterned radiation, the positioning system adjusts the position of the mask relative to the wafer, the lens assembly images the spatially patterned radiation onto the wafer, and the interferometry system measures the position of the mask relative to the wafer.

In general, in another aspect, the invention is directed towards a beam writing system for use in fabricating a lithography mask, the system includes a source to provide a write beam to pattern a substrate, a stage to support the substrate, a beam directing assembly to deliver the write beam to the substrate, a positioning system to position the stage and beam directing assembly relative one another, and at least one of the interferometry system described above. The interferometry system measures the position of the stage relative to the beam directing assembly.

In general, in one aspect, the invention is directed towards an interferometry system that includes a multiple-pass interferometer including reflectors to reflect at least a first beam along a first path and a second beam along a second path, the first and second paths each including at least a first set of passes and a second set of passes through the interferometer, the reflectors having first alignments that are normal to the directions of the paths of the beams that are reflected by the reflectors. The relative shear between the paths of the beams changes as the beams make the first and second set of passes through the interferometer when at least one of the reflectors has an alignment other than the first alignment. The interferometry system further includes optics to redirect the beams after the first set of passes and before the second set of passes so that shear imparted during the second set of passes cancels shear imparted during the first set of passes.

Implementations of the invention may include one or more of the following features. The first and second paths do not overlap during the first and second set of passes. The interferometry system further includes a beam splitter to separate an input beam into the first and second beams prior to either of the first and second beams propagate through the first set of passes. The interferometry system further includes a second beam splitter to combine the first and second beams after both of the first and second beams propagate through the second set of passes. The interferometry system further includes a beam splitter that cooperates with the reflectors to reflect the first beam along the first path and the second beam along the second path. One of the reflectors is disposed between the beam splitter and another one of the reflectors. The multi-pass interferometer includes a differential plane mirror interferometer.

In general, in one aspect, the invention is directed towards an interferometry system that includes a multiple-pass interferometer including reflectors to reflect at least two beams along multiple passes through the interferometer, the multiple passes including a first set of passes and a second set of passes. The reflectors have first alignments. The shear between the paths of the two beams changes during the first set of passes and during the second set of passes if one of the reflectors moves from the first alignment to a second alignment different from the first alignment. The interferometry system further includes optics to redirect the beams after the first set of passes and before the second set of passes so that shear imparted during the second set of passes due to a deviation of one of the reflectors from the first alignment cancels shear imparted during the first set of passes due to the deviation.

Implementations of the invention may include one or more of the following features. The interferometer further includes a polarizing beam splitter to separate an input beam into the at least two beams. The optics comprise an odd number of plane reflection surfaces.

In general, in another aspect, the invention is directed towards an interferometry method that includes directing at least two beams along multiple passes through an interferometer, the multiple passes including a first set of passes and a second set of passes, the reflectors having first alignments that are normal to the directions of the paths of the beams that are reflected by the reflectors, and causing shear that is imparted in the first set of passes to be cancelled by shear imparted in the second set of passes by redirecting the beams after the first set of passes and before the second set of passes.

Implementations of the invention may include one or more of the following features. Redirecting the beams includes using an odd number of plane mirrors to redirect the beams. Redirecting the beams includes redirecting the beams so that the beams after being redirected travel in directions opposite but parallel to the propagation directions of the beams before being redirected. Redirecting the beams includes redirecting the beams so that the magnitude and direction of shear of the beams after being redirected are the same as the magnitude and direction of shear of the beams before being redirected. The interferometry method further includes separating an input beam into the at least two beams. The interferometry method further includes combining the beams after the multiple passes through the interferometer to form overlapping beams. The interferometry method further includes detecting interference signals from the overlapping beams. The interferometry method further includes estimating a change in the optical path length of one of the beams based on the interference signal. The interferometry method further includes estimating a change in the optical path length difference between two of the at least two beams based on the interference signal.

In general, in another aspect, the invention is directed towards a lithography method that includes supporting a wafer on a stage, imaging spatially patterned radiation onto the wafer, adjusting the position of the stage relative to the imaged radiation, and using the interferometry method described above to measure the relative position of the stage.

In general, in another aspect, the invention is directed towards a lithography method that includes supporting a wafer on a stage, directing radiation from a source through a mask to produce spatially patterned radiation, positioning the mask relative to the wafer, using the interferometry method described above to measure the position of the mask relative to the wafer, and imaging the spatially patterned radiation onto the wafer.

In general, in another aspect, the invention is directed towards a beam writing method that includes providing a write beam to pattern a substrate, supporting the substrate on a stage, delivering the write beam to the substrate, positioning the stage relative to the write beam, and using the interferometry method described above to measure the relative position of the stage.

In general, in another aspect, the invention is directed towards an interferometry method that includes directing at least two beams along multiple passes through an interferometer, the multiple passes including a first set of passes and a second set of passes, the reflectors having first alignments, and redirecting the two beams after the first set of passes and before the second set of passes to cause shear that is imparted in the first set of passes caused by one of the reflectors moving from the first alignment to a second alignment to be cancelled by shear imparted in the second set of passes caused by the movement of the reflector from the first alignment to the second alignment.

Implementations of the invention may include one or more of the following features. The interferometry method further includes separating an input beam into the at least two beams. The interferometry method further includes overlapping the two beams after the second set of passes.

Other features, objects, and advantages of the invention will be apparent from the following detailed description.

DESCRIPTION OF DRAWINGS

Like reference symbols in the various drawings indicate like elements.

DETAILED DESCRIPTION

Figure 1:
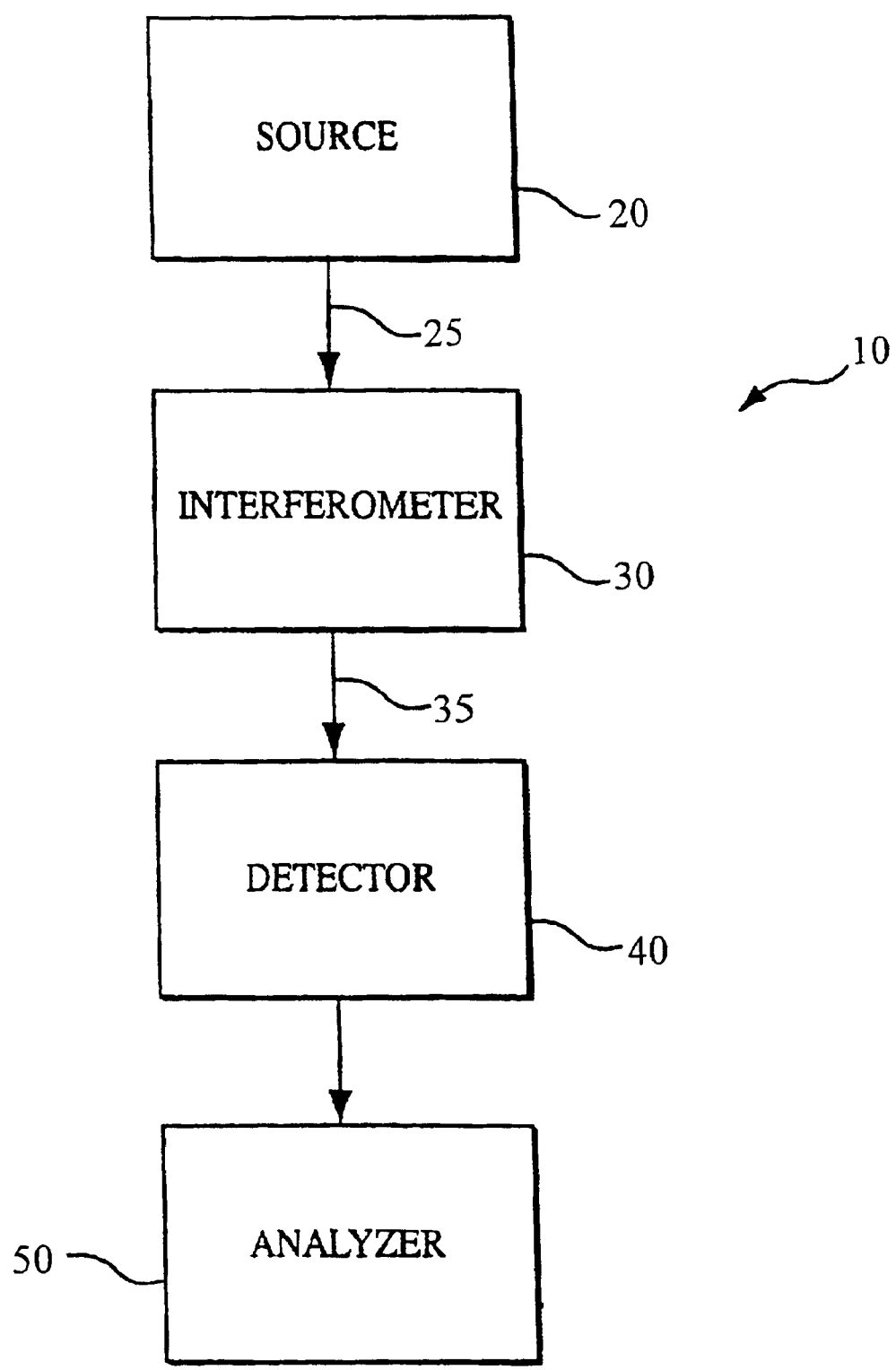
FIG. 1 is a diagram of an interferometry system.
Figure 2:
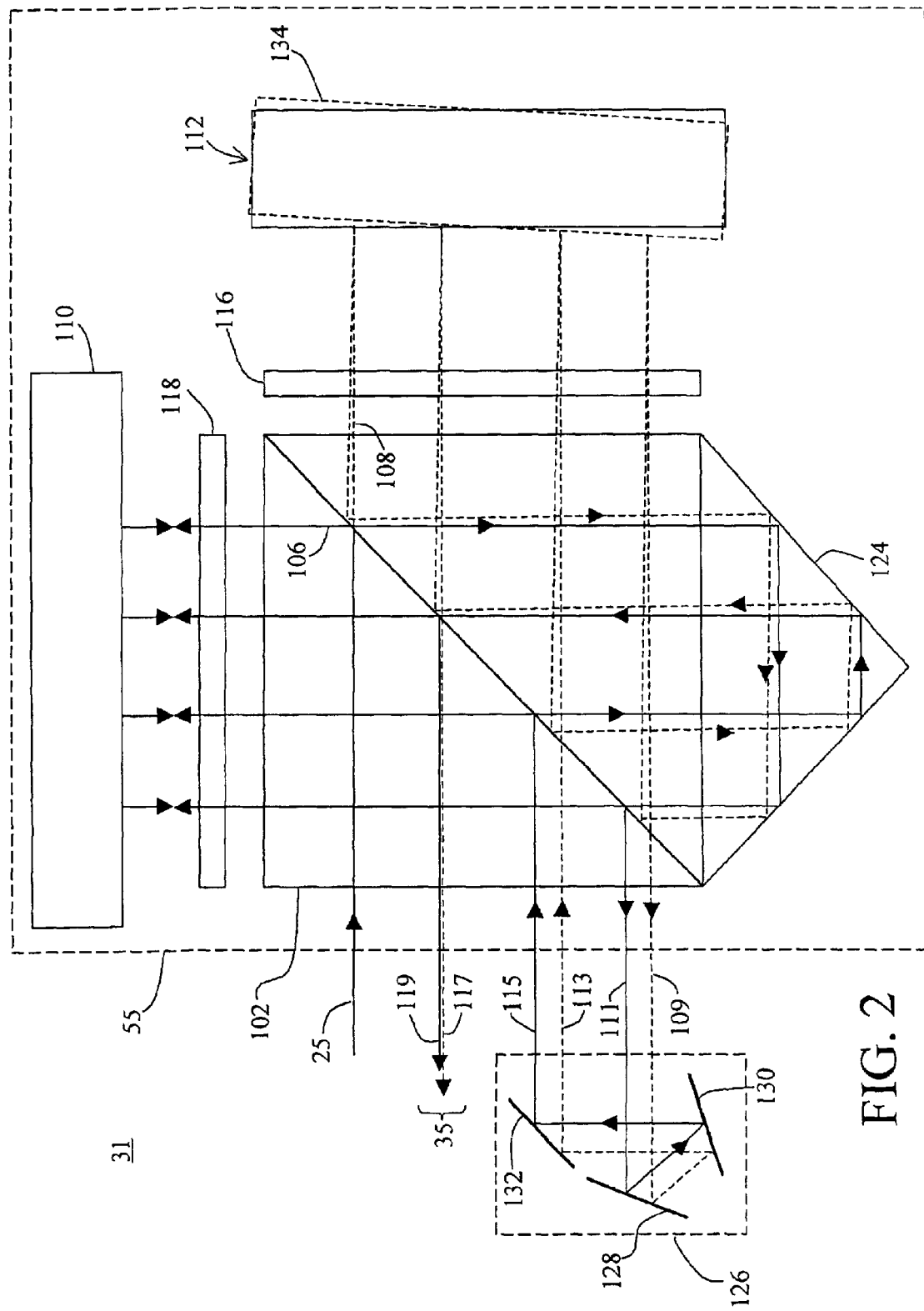
FIG. 2 shows an interferometer.

Referring to FIG. 2, an interferometry system 31 includes a four-pass interferometer 55 and a reflector assembly 126. Interferometer 55 includes a polarizing beam splitter (PBS) 102, quarter wave plates 116, 118, a reference mirror 110, a measurement mirror 112, and a retroreflector 124. PBS 102 receives an incoming beam 25 and directs a corresponding reference beam 106 (shown in solid lines) and a corresponding measurement beam 108 (shown in dashed lines) along separate paths and later combines the beams to form overlapping exit beams 35.

Beam shear in exit beams 35 may be reduced by the reflector assembly 126 (enclosed in dashed lines), which is interposed optically between the first two passes and the last two passes of the reference and measurement beams through the interferometer. Reflector assembly 126 is configured so that the magnitude and direction of shear between the reference and measurement beams are preserved after being reflected by the reflector assembly.

In the example shown in FIG. 2, this is achieved by including in the reflector assembly three plane mirrors 128, 130, 132 arranged relative to the reference and measurement beams so that the beams are redirected in a direction parallel but opposite to the original propagation direction. In one example, the mirrors are oriented so that the angles between a horizontal line in the figure and mirrors 128, 130, and 132 are 67.5, 22.5, and 45 degrees, respectively. This arrangement tends to maintain accurate overlap of the exit beams 35 and to reduce beam shear when the measurement mirror 112 and/or the reference mirror 110) are not properly aligned with the PBS 102.

For example, if the measurement mirror 112 were tilted at a slight angle to a position 134, shown in dashed lines, the measurement beam 109 and the reference beam 111 would be parallel but not coextensive (i.e., a shear would exist between the two beams) after being reflected from mirrors 112 and 110 on their second pass through the PBS. Different reference numerals are used to refer to the same beam when describing the beam at different locations.

Upon reflection by mirrors 128, 130, and 132, beams 109 and 111 become beams 113 and 115, respectively. The magnitude and direction of shear between beams 115 and 113 will be the same as those between beams 111 and 109. As beam 113 makes the third and fourth passes through PBS 102, beam 113 is reflected by the tilted mirror 112 in a way to generate a shear that substantially cancels the shear caused by the tilt in mirror 112 during the first and second passes. After being reflected by the tilted mirror 112 during the fourth pass, measurement beam 117 becomes parallel to and coincide with reference beam 119 so that there is substantially no shear between the two exit beams. A similar analysis applies to the reference beam and tilt of the reference mirror.

Figure 2A:
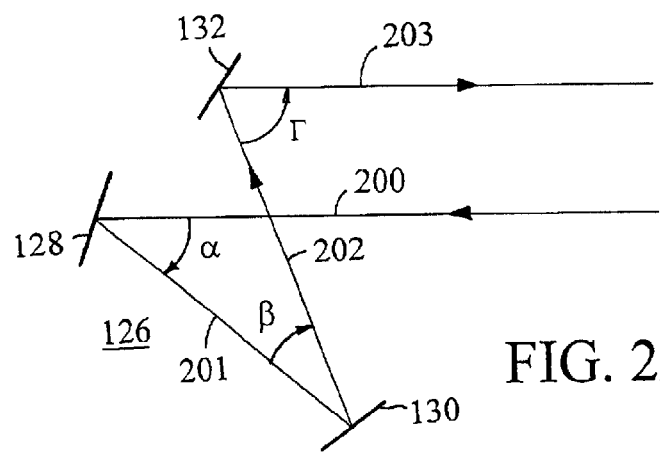
FIGS. 2A–2C show reflection assemblies.
Figure 2B:
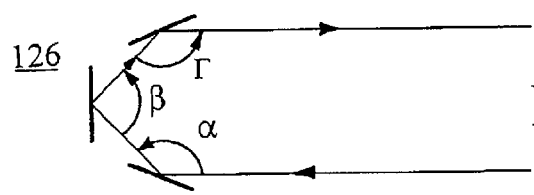

The three plane mirrors in reflection assembly 126 may be arranged in several different configurations. FIGS. 2A and 2B shows two examples of suitable configurations for reflection assembly 126. The mirrors are arranged so that the sum of the angles between incident and reflection beams are zero or multiples of 360 degrees. In FIG. 2A, angle α has a negative value (representing a clockwise rotation from beam 200 to beam 201), angle β has a negative value, and angle γ has a positive value (representing a counter clockwise rotation from beam 202 to beam 203). The mirrors 128, 130, and 132 are arranged so that α+β+γ=0. In FIG. 2B, angles α, β, and γ have positive values (representing counter clockwise rotation from an incident beam of a mirror to a reflection beam). Mirrors 128, 130, and 132 are arranged so that α+β+γ=360 degrees. In general, the mirrors can be arranged in different configurations as long as the sum of α, β, and γ are zero or multiples of 360 degrees.

In FIGS. 2A and 2B, the mirrors have normals that lie in a common plane (the plane of FIGS. 2A and 2B). In general, it is possible to design the reflection assembly so that the normals of the mirrors do not lie in a common plane but will still compensate a shear caused by a tilt of the measurement mirror. For example, in FIG. 2C, a reflector assembly 208 includes mirrors 128, 130, 132, and a cube corner retroreflector 204, with a total of six reflection surfaces (the normals of the reflection surfaces of the retroreflector do not lie in a common plane). Mirrors 128, 130, and 132 are arranged so that beam 205 is parallel to beam 200, and both beams 200 and 205 travel in the same direction. Retroreflector 204 redirects beam 205 into beam 206. Beam 206 is parallel to beam 200 but travel in opposite directions. Reflection assembly 208 has the same transformation properties as reflector assembly 126 of FIG. 2A or 2B, such that the magnitude and direction of beam shear of beam 206 is the same as the magnitude and direction of beam shear of beam 200.

In the examples shown in FIGS. 2–2B, reflector assembly 126 included three plane mirrors. In other examples, another odd number (greater than three) of plane mirrors can be used as well. An odd number of reflections from the mirrors that have normals that lie in a common plane will cause the direction and magnitude of shear between beams incident on the reflector assembly to be the same the direction and magnitude of shear between the beams that are reflected from the reflector assembly, where the shear is caused by a tilt of the measurement mirror.

Figure 2C:
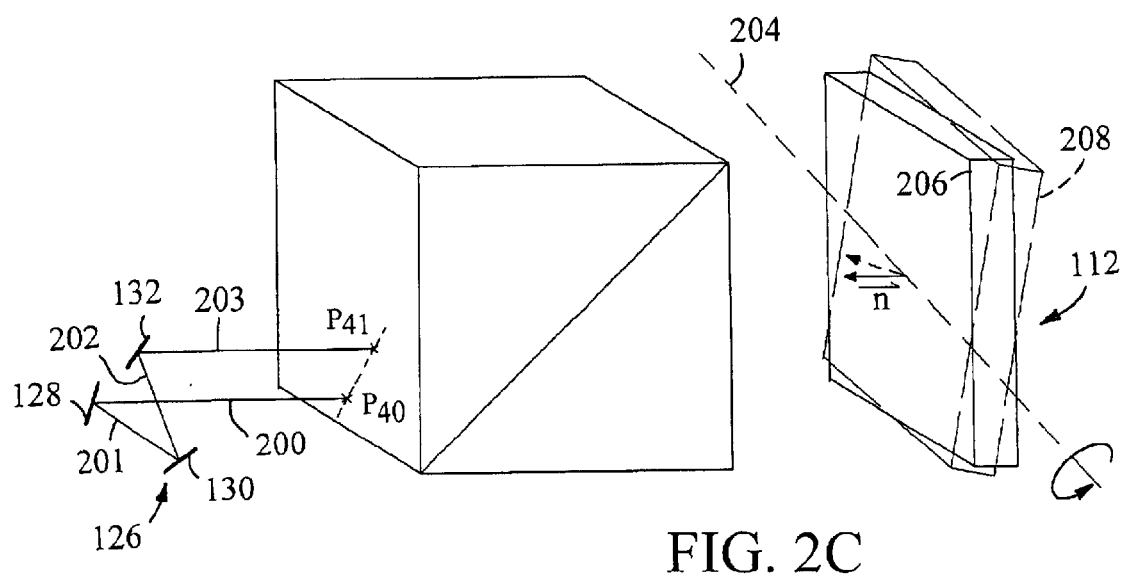

The reflection assembly shown in FIGS. 2–2C can compensate for beam shear caused by an arbitrary rotation of the measurement mirror, i.e., a rotation about either of two axes that are orthogonal with respect to each other and orthogonal to the normal to the measurement mirror. Regardless of the magnitude and direction of shear due to a tilt in the measurement mirror, the shear imparted to the measurement beam during the first and second passes will be canceled by shear imparted to the measurement beam during the third and fourth passes.

Figure 3:
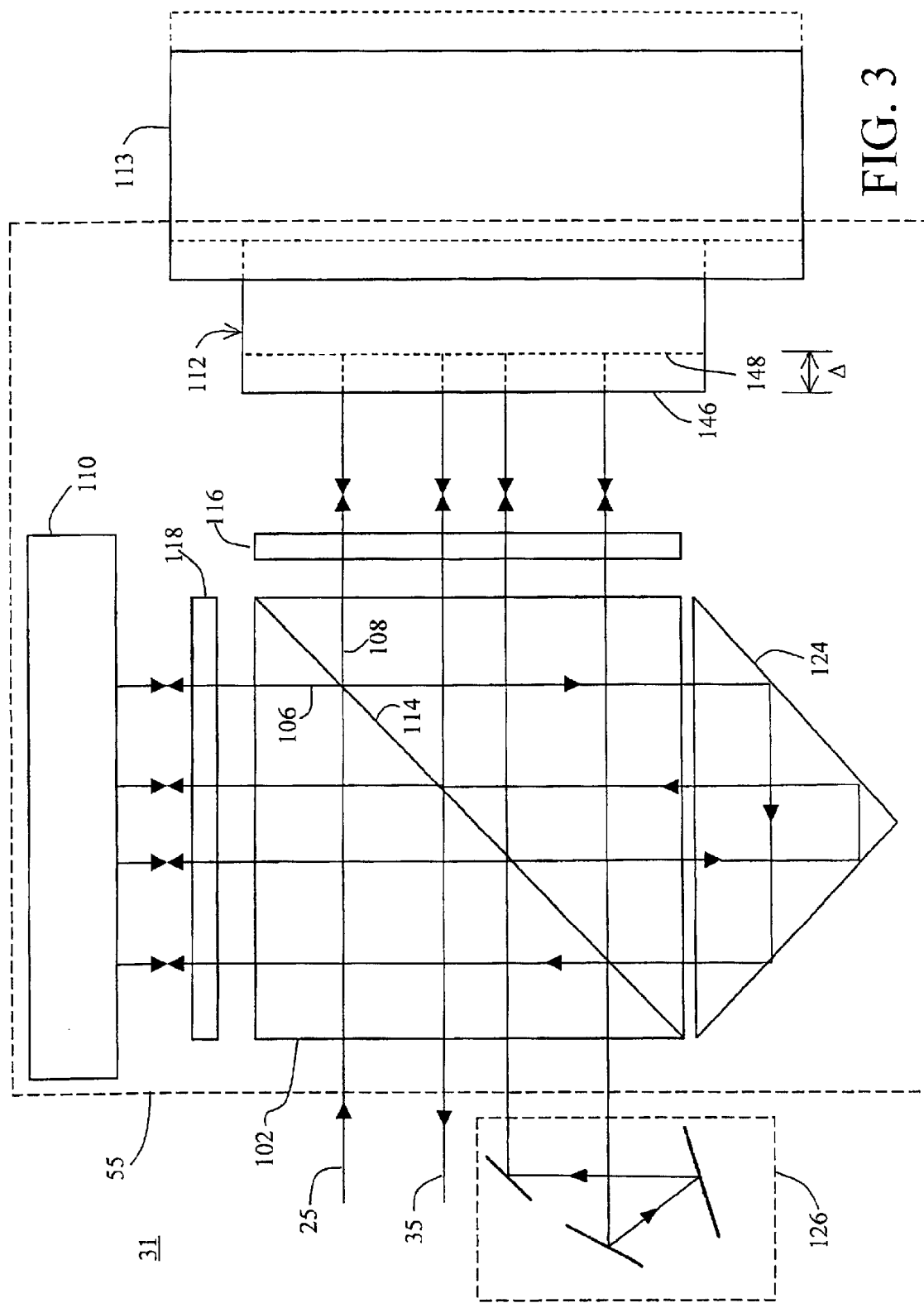
FIGS. 3–9B show interferometers.
Figure 4:
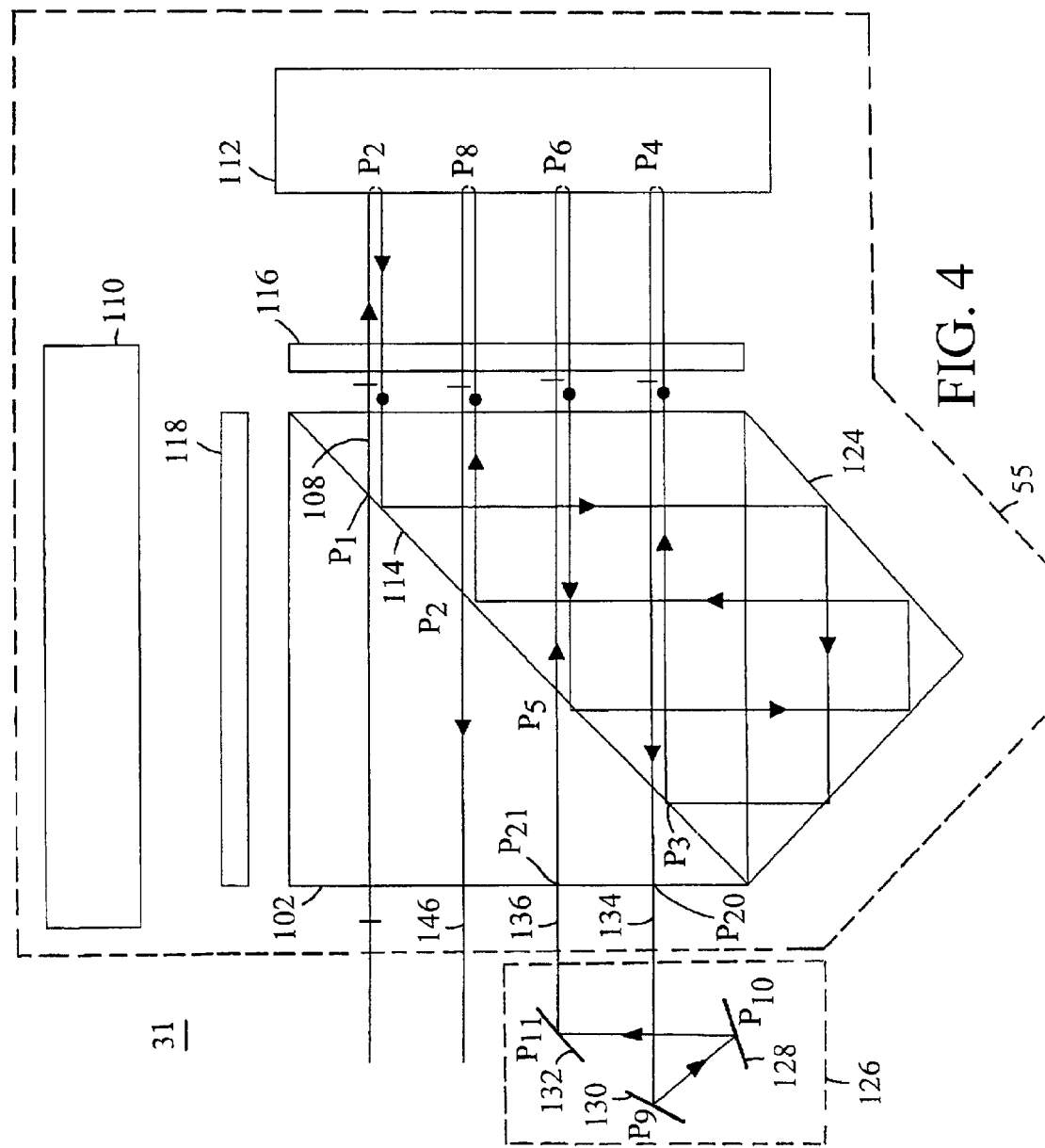
Figure 6:
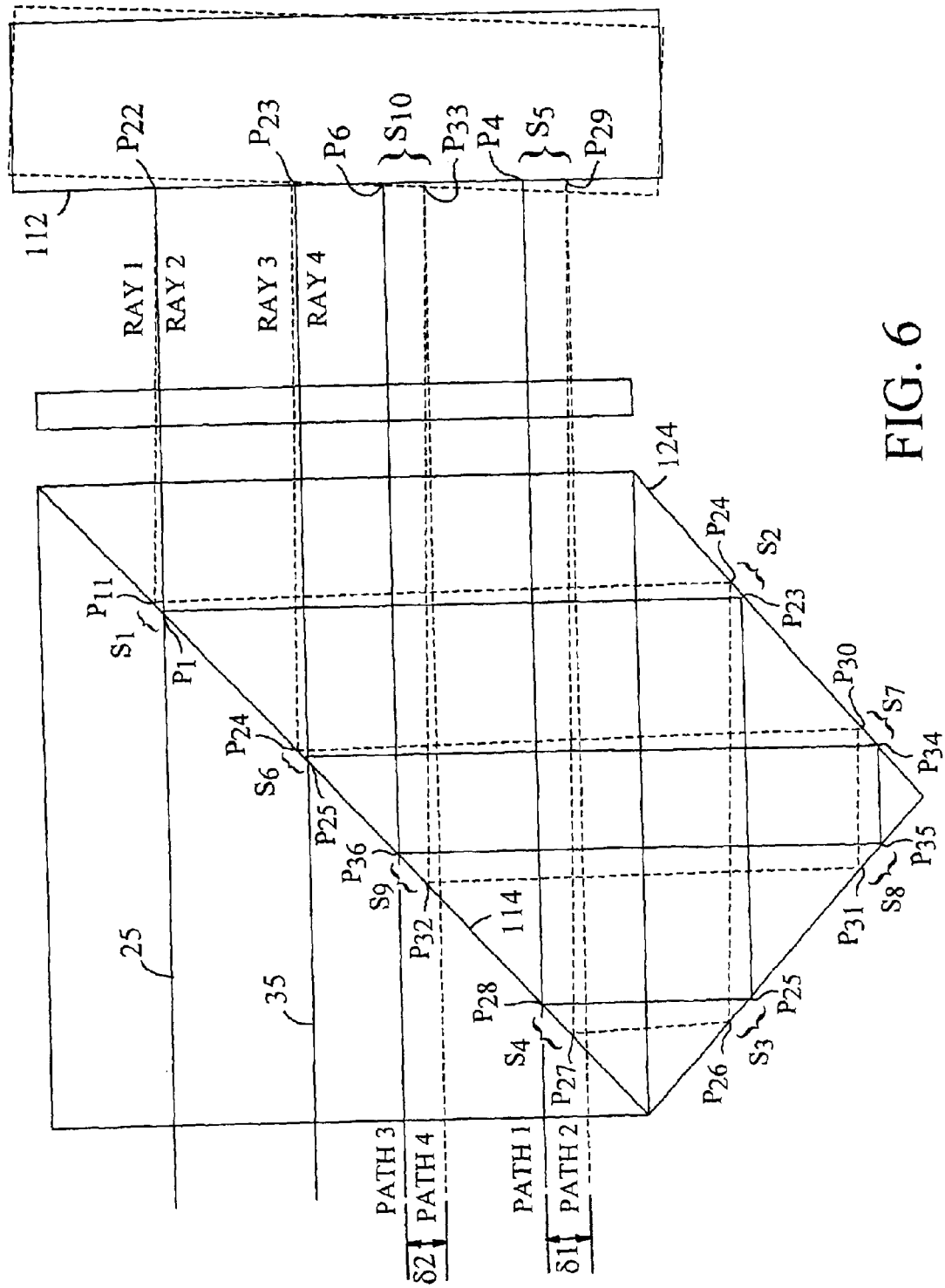

Referring to FIG. 3, PBS 102 includes a beam-splitting surface 114 that separates orthogonal components of input beam 25 into the reference beam 106 and the measurement beam 108. Measurement beam 108 (which is transmitted through surface 114) is mostly polarized in a direction parallel to the plane of incidence, and is referred to as a "p-polarized" beam. Here, the plane of incidence is parallel to the plane of the paper of FIG. 3. Reference beam 106 (which is reflected from surface 114) is mostly polarized perpendicular to the plane of incidence, and is referred to as an "s-polarized" beam. In FIGS. 4 and 6, a short line on a beam will be used to represent p-polarization, and a dot on a beam will be used to represent s-polarization.

Reference beam 106 travels along a reference path that contacts reference mirror 110. Measurement beam 108 travels along a measurement path contacting measurement mirror 112. Both the reference and measurement mirrors are plane mirrors. In the figures, a beam overlaps with a path where the beam travels, thus the beam and path are depicted by the same line. Measurement plane mirror 112 may be attached to an object (e.g., a lithography stage 113). Reference beam 106 and measurement beam 108, after passing through PBS 102 a number of times, four in this example, are combined to form the pair of overlapping exit beams 35.

When measurement mirror 112 moves from a position 146 to another position 148, the optical path length difference between reference path and measurement path will change, resulting in changes in an interference of the overlapping exit beams 35 that can be detected by detector 40. An analyzer (e.g., 50) then calculates a physical change in position Δ based on the changes in the optical path length difference.

Referring to FIG. 4, measurement beam 108 makes four passes through interferometer 55. The description below about the four passes assumes that measurement mirror 112 and PBS 102 are initially aligned such that the surface of mirror 112 is positioned at an angle of 45 degrees relative to beam-splitting surface 114. The start and end points of each pass are selected for purpose of illustration only.

During the first pass, beam 108 starts at point $P_1$ on beam-splitting surface 114, is reflected by 112 at point $P_2$, then eventually contacts point $P_3$ on surface 114. In FIG. 4, portions of beam 108 traveling toward and away mirror 112 are shown spaced apart for clarity of illustration. In fact, when the angle of incidence of beam 108 on mirror 112 at $P_2$ is zero, the beams traveling to and from the mirror will coincide, i.e., they have parallel directions of propagation.

During the second pass, beam 108 starts at point $P_3$, is reflected by mirror 112 at point $P_4$, exits PBS 102 at point $P_{20}$, and propagates toward reflector assembly 126. Beam 108, when traveling toward reflector assembly 126, is referred to as an intermediate beam 134. Interferometer 30 is configured so that intermediate beam 134 is parallel to input beam 25.

Reflector assembly 126 includes plane mirrors 128, 130, and 132. Beam 108 is reflected by plane mirror 130 at point $P_9$, reflected by plane mirror 132 at point $P_{10}$, and reflected by plane mirror 132 at point $P_{11}$ in sequence. Beam 108, when traveling away from reflector assembly 126, is referred to as a return intermediate beam 136. Mirrors 128, 130, and 132 are oriented such that the surface normals of mirrors 128, 130, and 132 are parallel to a common plane (e.g., the plane of FIG. 4). Mirrors 128, 130, and 132 are also oriented so that return intermediate beam 136 is parallel to intermediate beam 134 with the two beams traveling in opposite directions.

During the third pass, beam 108 enters PBS 102 at point $P_{21}$, and passes through surface 114 at a point $P_5$. Beam 108 is reflected by mirror 112 at point $P_6$, then eventually contacts point $P_7$. During the fourth pass, beam 108 starts at point $P_7$, is reflected by mirror 112 at point $P_8$, eventually becomes an exit beam 146. Interferometer 30 is configured so that return intermediate beam 136 is parallel to exit beam 146. Because beam 136 is parallel to beam 134, which in turn is parallel to input beam 25, exit beam 146 is parallel to input beam 25. Furthermore, there is no shear of the measurement beam relative to the reference beam in the output beam 146.

If the angle of incidence of beam 108 on mirror 112 at $P_2$ is not zero, beam 108 will not trace its original path back to point $P_1$ after reflection by mirror 112.

Figure 5:
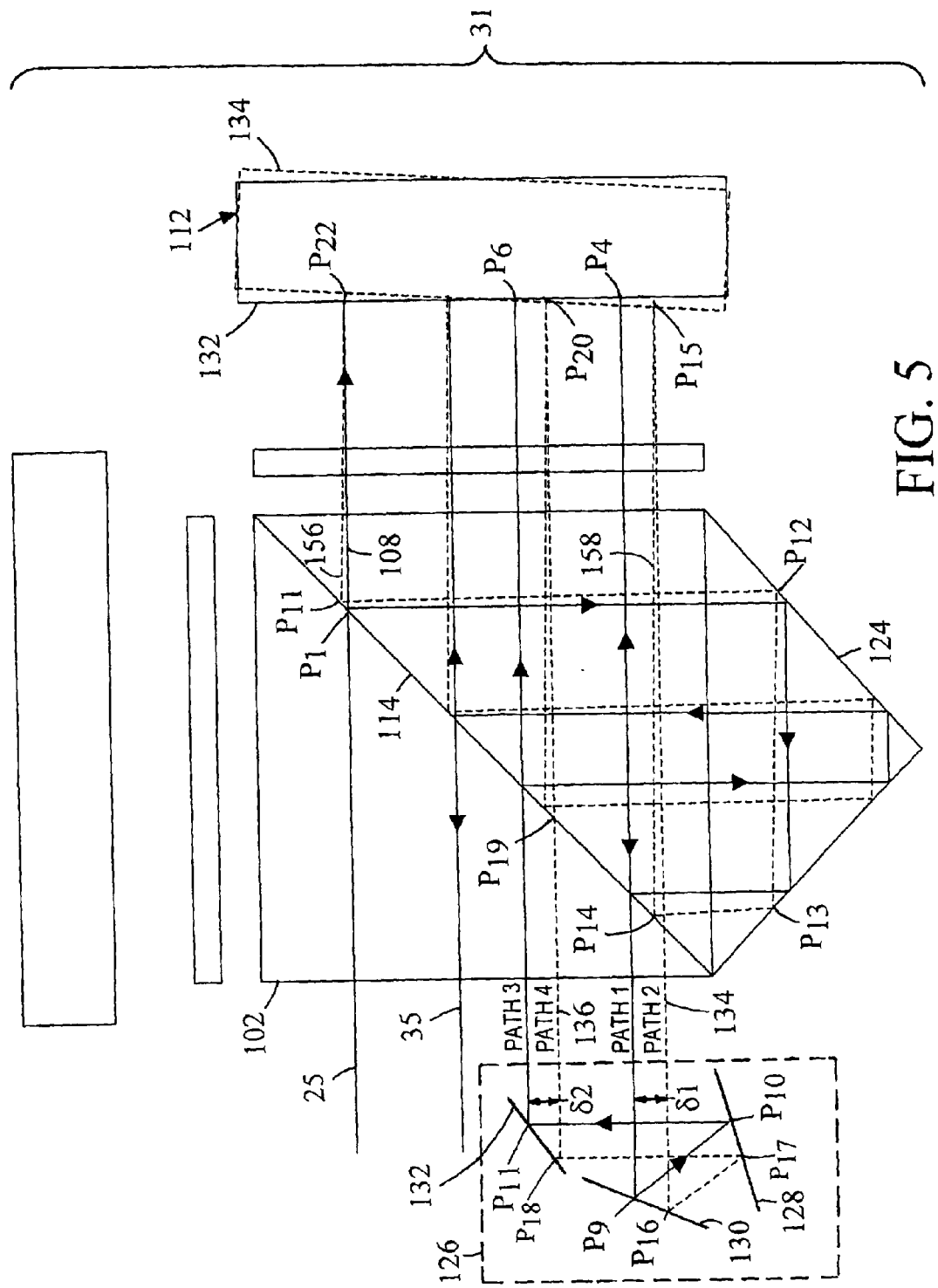

Referring to FIG. 5, when measurement mirror 112 is tilted at an angle relative to beam-splitting surface 114, beam 108 will contact point $P_{11}$ (instead of point $P_1$) on surface 114 after being reflected by mirror 112 at point $P_{22}$. Mirror 112 is shown in solid lines when placed at an aligned position 132, and shown in dashed lines when placed at a tilted position 134 (i.e., tilted relative to the aligned position 132). Solid lines depict the measurement path (referred to as the original measurement path) traveled by beam 108 when mirror 112 is at the aligned position 132 such that the angle of incidence of beam 108 on mirror 112 at $P_2$ is zero. Dashed lines are used to depict the measurement path (referred to as the modified measurement path) when mirror 112 is at the tilted position 134. The deviation between the original and modified measurement paths increases as beam 108 travels toward reflector assembly 126.

When mirror 112 is tilted, during the first pass, beam 108 is reflected by beam-splitting surface 114 and retroreflector 124. Beam 108 travels along the path shown in dashed lines, and contacts points $P_{11}$, $P_{12}$, $P_{13}$, $P_{14}$, and $P_{15}$ in sequence. Retroreflector 124 includes, for example, a cube corner reflector with three internal reflection surfaces. During the second pass, after reflection from point $P_{15}$, beam 108 is reflected at points $P_{16}$, $P_{17}$, and $P_{18}$, and passes through point $P_{19}$.

To facilitate description of shifts in beam paths when mirror 112 is tilted, assume that a path connecting points $P_4$ and $P_9$ is referred to as path 1, a path connecting points $P_{15}$ and $P_{16}$ is referred to as path 2, a path connecting points $P_{11}$ and $P_6$ is referred to as path 3, and a path connecting points $P_{18}$ and $P_{19}$ is referred to as path 4. Beam 108 travels along paths 1 and 3 when mirror 112 is in the initial aligned position, i.e., the angle of incidence of beam 108 on mirror 112 at $P_2$ is zero. Beam 108 travels along paths 2 and 4 when mirror 112 is tilted relative to the initial aligned position. Mirrors 128, 130, and 132 are positioned and oriented so that if path 2 is parallel to and offset from path 1, then path 4 will be parallel to and offset from path 3. The offset distance $\delta_2$ between path 3 and path 4 will be the same as the offset distance $\delta_1$ between path 1 and path 2. Also, the direction of the offset (or shift) from path 3 to path 4 (downward in the figure) will be the same as the direction of shift from path 1 to path 2.

When the direction of shift of intermediate beam 134 (shift from path 1 to path 2) caused by a tilt in mirror 112 is the same as the direction of shift of return intermediate beam 136 (shift from path 3 to path 4), the deviation between the original and modified measurement beam paths will decrease as beam 108 travels away from reflector assembly 126 and makes the third and fourth passes through interferometer 30. As shown in FIG. 3, when both reference mirror 110 and measurement mirror 112 are in initial aligned positions, measurement beam 108 and reference beam 106 will exit interferometer 30 along paths that are coextensive (i.e., beams 106 and 108 will travel in parallel and identical direction, and completely overlap). Therefore, as the deviation between the original and modified measurement paths decreases during the third and fourth passes, the beam shear between measurement beam 108 and reference beam 106 also decreases.

The decrease in deviation between original and modified measurement paths can be illustrated as follows. Referring to FIG. 6, assume ray 1 and ray 2 emanate from point $P_{22}$ and propagate toward points $P_{11}$ and $P_1$, respectively. Rays 1 and 2 will be reflected by beam-splitting surface 114 and retroreflector 124, and will diverge farther apart as they travel from region $S_1$ through $S_2$, $S_3$, $S_4$, to $S_5$. Ray 1 will contact points $P_{11}$, $P_{24}$, $P_{26}$, $P_{27}$, and $P_{29}$. Ray 2 will contact points $P_1$, $P_{23}$, $P_{25}$, $P_{28}$, and $P_4$. Likewise, assume ray 3 and ray 4 emanate from point $P_{23}$ and propagate toward points $P_{24}$ and $P_{25}$. The two rays will diverge further as they travel from region $S_6$ through $S_7$, $S_8$, $S_9$, to $S_{10}$. Ray 3 will contact points $P_{24}$, $P_{30}$, $P_{31}$, $P_{32}$, and $P_{33}$. Ray 4 will contact points $P_{25}$, $P_{34}$, $P_{35}$, $P_{36}$, and $P_6$. Because the path length traveled by rays 1, 2, 3, and 4 are similar, if the angle between rays 1 and 2 equals the angle between rays 3 and 4, then the distance between pints $P_6$ and $P_{33}$ and the distance between points $P_4$ and $P_{29}$ will be the same.

The distance between points $P_4$ and $P_{29}$ can be viewed as the amount of shear between the original and modified measurement paths after the measurement beam makes the first and second passes through interferometer 55 when mirror 112 is tilted. The distance between points $P_6$ and $P_{33}$ can be viewed as the amount of shear between the original and modified measurement paths after the measurement beam is redirected by reflector assembly 126. Tracing the shear from region $S_{10}$ through $S_9$, $S_8$, $S_7$, $S_6$ to point $P_{23}$, it can be seen that the shear is canceled as the measurement beam makes the third and fourth passes through interferometer 55.

The derivation above assumes that the angle between rays 1 and 2 equals the angle between rays 3 and 4. The assumption is true when path 4 is parallel to path 2 and distance $\delta_1$ is equal to distance $\delta_2$, because the path connecting points $P_{33}$ and $P_{32}$ would be parallel to the path connecting points $P_{29}$ and $P_{27}$, the path connecting points $P_{32}$ and $P_{31}$ would be parallel to the path connecting points $P_{27}$ and $P_{26}$, and so forth.

Figure 7:
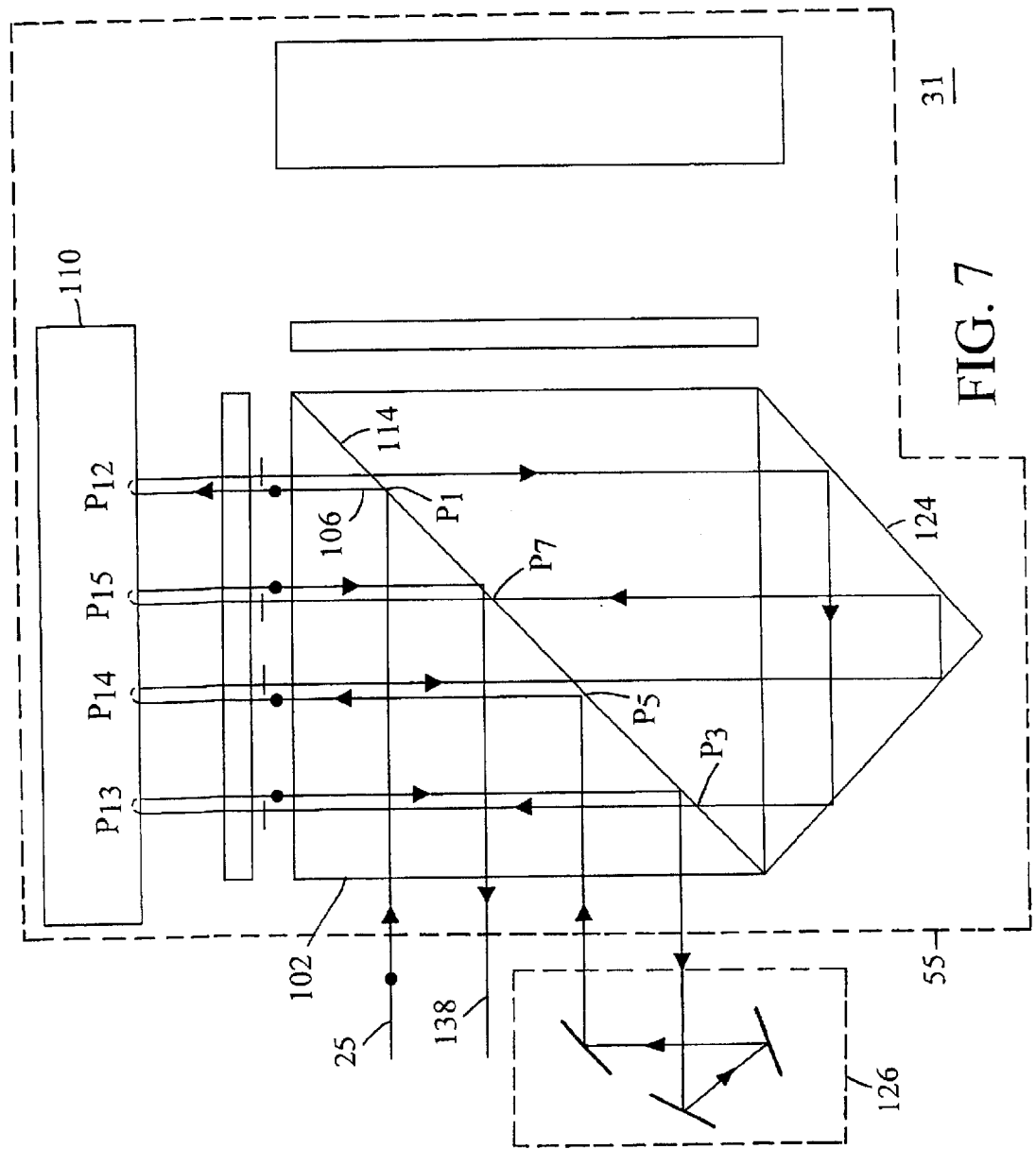

Referring to FIG. 7, we now consider the reference beam 106 which is formed by a component of input beam 25 with s-polarization that is reflected by beam-splitting surface 114 at point $P_1$. Beam 106 makes four passes through interferometer 55. The following describes the four passes when mirror 110 is an aligned position, i.e., the angle of incidence of beam 114 on mirror 110 at point $P_{12}$ is zero. During the first pass, beam 106 starts from point $P_1$, is reflected by reference mirror 110 at point $P_{12}$, is reflected by retroreflector 124 and contacts $P_3$. During the second pass, beam 106 is reflected by mirror 110 at point $P_{13}$, is received and reflected by reflector assembly 126, and contacts point $P_5$. During the third pass, beam 106 is reflected by mirror 110 at point $P_{14}$, is reflected by retroreflector 124, and contacts $P_7$. During the fourth pass, beam 106 is reflected by mirror 110 at point $P_{15}$ and forms an exit beam 138.

Figure 8:
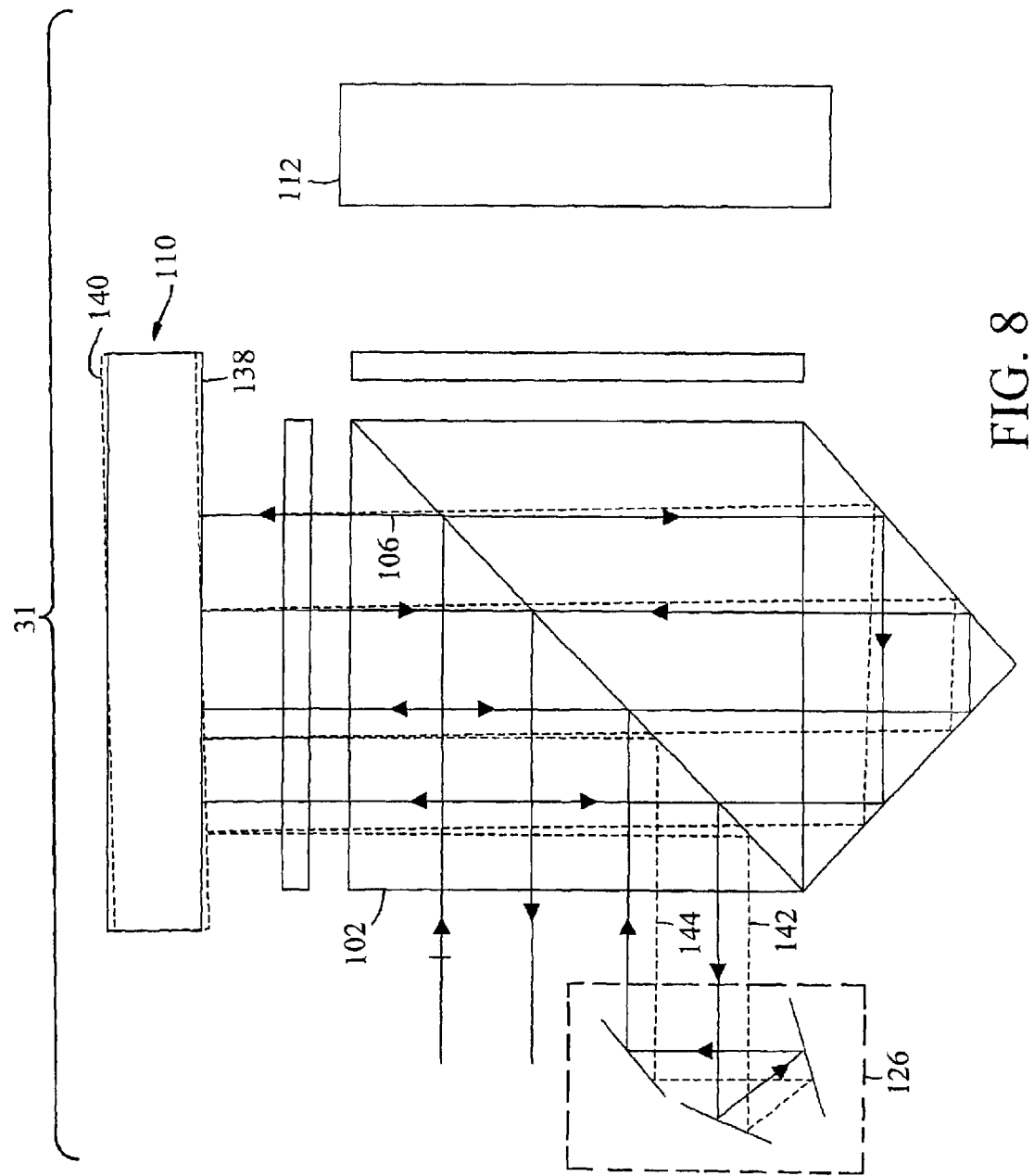

Referring to FIG. 8, when mirror 110 is at an initial aligned position 138, beam 106 travels a path shown in solid lines, which is referred to as the original reference path. When mirror 110 is at a tilted position 140 (i.e., tilted relative to the aligned position 138), beam 106 travels a path shown in dashed lines, which is referred to as the modified reference path. As beam 106 travels toward reflector assembly 126 during the first and second passes through the interferometer, the deviation between the original and modified measurement paths increases.

When beam 106 is reflected by reflector assembly 126, the direction of shear (or shift), which is downward in the figure, of an intermediate beam 142 caused by a tilt in mirror 110 (from position 138 to position 140) is the same as the direction of shear (or shift) of a return intermediate beam 144. Because the magnitude and direction of the shears of intermediate beam 142 and return intermediate beam 144 are the same, the shear between the original and modified reference paths will decrease as beam 144 travels away from reflector assembly 126 during the third and fourth passes through the interferometer. The analysis for the decrease in shear for the modified reference path is similar to the analysis for the modified measurement path in FIG. 6. As the shear between the original and modified reference paths decreases, the shear between reference beam 106 and measurement beam 108 also decreases.

Figure 9:
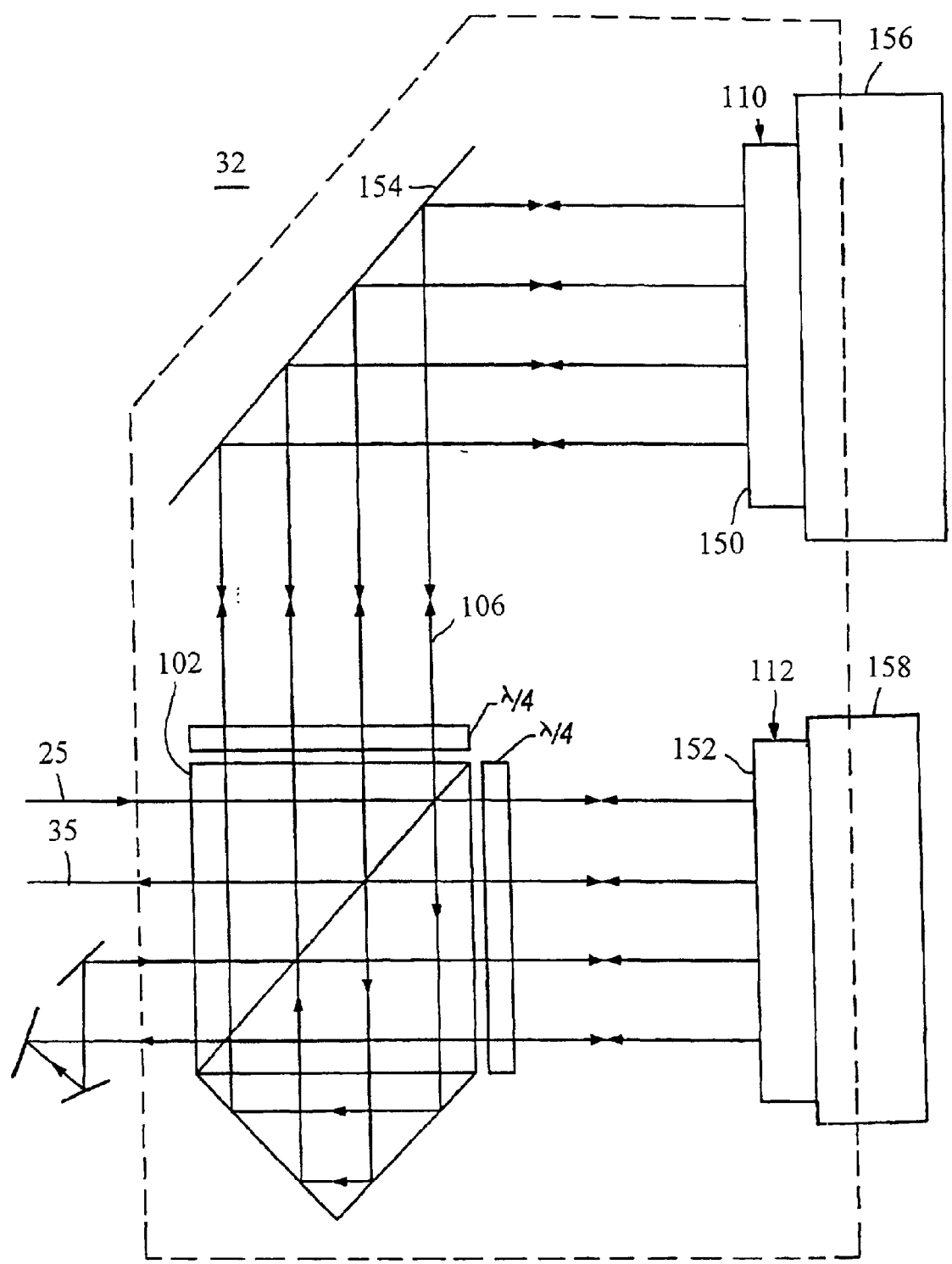

Referring to FIG. 9, in another example of an interferometry system 32, reference mirror 110 is attached to a reference object 156, which may be stationary or movable. Mirror 112 is attached to a measurement object 158, which is movable relative to reference object 156. As an example, reference object 156 may be a stage on which a wafer is mounted, and measurement object 158 may be a stage for an e-beam used to write a pattern on the wafer.

Mirror 110 is positioned so that the incidence angle of beam 106 on a surface 150 of mirror 110 is zero. Reference beam 106 is reflected by a fold mirror 154 as beam 106 travels between PBS 102 and mirror 110. The operation principles of interferometer 32 are similar to those of interferometer 31. Changes in interference of the overlapping exit beams 35 are indicative of changes in optical path length differences between the reference and measurement paths. The changes in optical path length differences are used to calculate the changes in relative positions of mirrors 110 and 112.

In the interferometry system of FIG. 9, in cases in which the reference mirror 110 is deliberately movable it tends to be more susceptible to tilting than the reference mirror of FIG. 2, which is intended to be fixed relative to the interferometer.

Referring to FIG. 9A, an interferometry system 33 includes a differential plane mirror interferometer 160 that directs a measurement beam 108 and a reference beam 106 along multiple passes through the interferometer. Interferometer 160 includes a PBS 162 that separates an input beam 25 into a reference beam 106 and a measurement beam 108, and a mirror 164 to direct beam 106 so that it travels in a direction parallel to beam 108. A half-wave plate 176 is used to rotate the polarization direction of beam 106 by 90 degrees so that beams 106 and 108 have the same polarization as they pass through interferometer 160, causing beams 106 and 108 to travel parallel paths through the interferometer.

Reference mirror 166 is fabricated with holes so that beam 108 can pass through mirror 166 while beam 106 is reflected by mirror 166. Beams 106 and 108 each makes two passes through interferometer 160 to form intermediate beams 170 and 168, respectively. Intermediate beams 170 and 168 are directed by a reflector assembly 126 to form return intermediate beams 174 and 172, respectively. Return intermediate beams 172 and 174 each makes two passes through interferometer 160 to form beams 178 and 176, respectively. Beam 178 passes through half-wave plate to form a beam 180, causing the polarization direction of beams 176 and 180 to be orthogonal. Beam 180 is reflected by mirror 182 and combined with beam 176 by a polarizing beam splitter 184 to form reference and measurement beam components of output beam 35.

When mirror 164 is at an aligned position so that the incidence angle of beam 108 on a reflection surface 186 of mirror 164 is zero, intermediate beams 168 and 170 will be parallel and have a relative beam shear $\delta_3$. Return intermediate beams 172 and 174 will also be parallel and have a relative beam shear $\delta_3$.

When mirror 164 is at a tilted position so that the incidence angle of beam 108 on reflection surface 186 is not zero, intermediate beam 168 will not be parallel to beam 170. After the reference and measurement beams make the first and second passes through interferometer 160, assume that the relative beam shear between beams 168 and 170 changes by an amount $\delta_4$ due to the tilt in mirror 164. Reflector assembly 126 is designed to redirect beams 170 and 168 into beams 174 and 172, such that the change in relative shear between beams 172 and 174 will be the same amount $\delta_4$ and in the same direction. For example, if mirror 164 rotates clockwise slightly, then beam 168 will shift downwards by a certain amount (e.g., $\delta_4$). Reflection assembly 126 is designed so that beam 172 will also shift downwards by the same amount (e.g., $\delta_4$). As the reference and measurement beams make the third and fourth passes through interferometer 160, the change in relative beam shear will be canceled so that the relative beam shear between beams 176 and 178 remains the same regardless of a tilt in mirror 164. This causes the measurement beam component and reference beam components of output beam 35 to be co-extensive (i.e., the two beam components travel in the same direction and completely overlap).

Figure 9B:
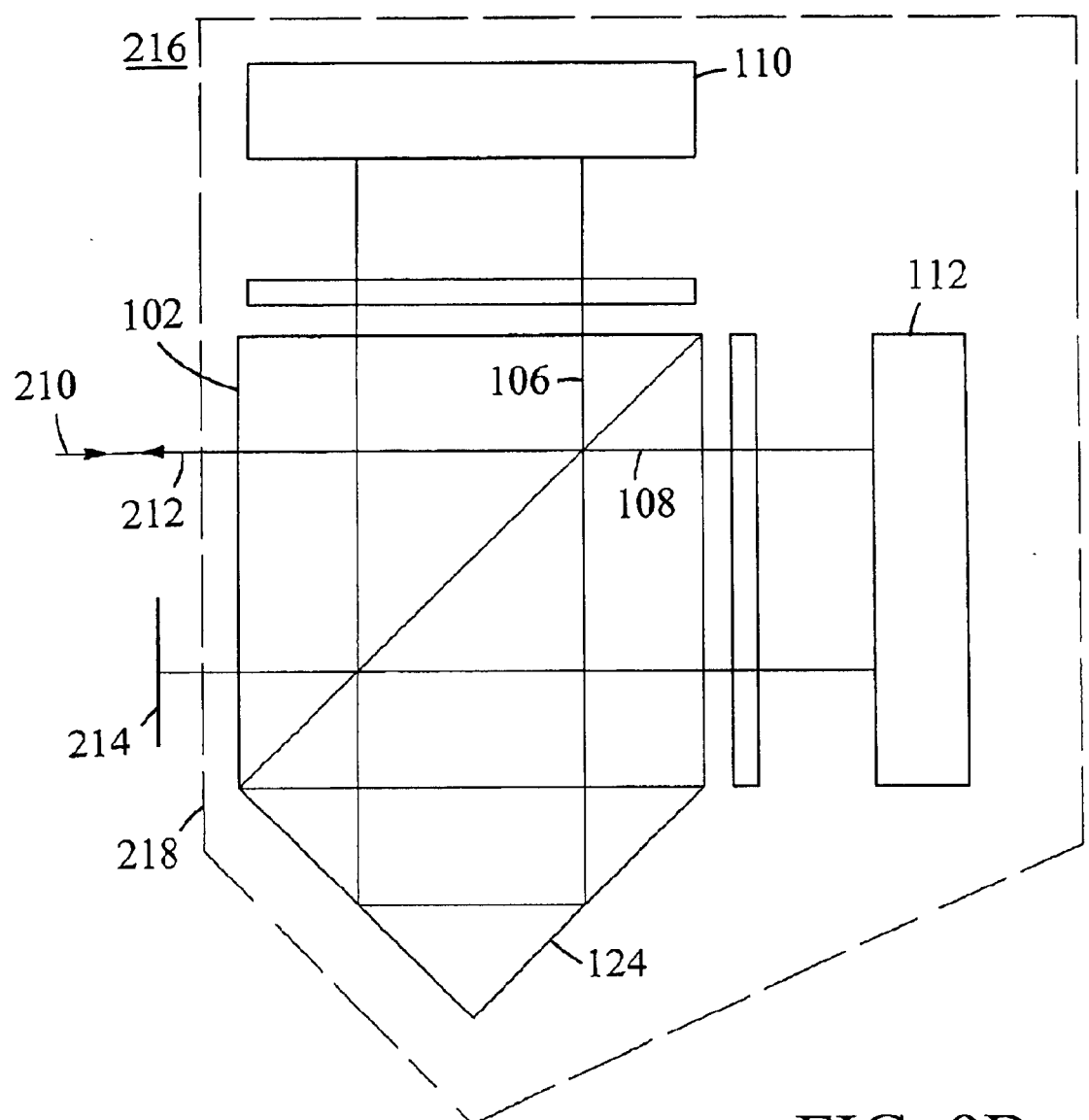

Referring to FIG. 9B, in another example of an interferometry system 216, an interferometer 218 includes a beam splitter 102 that separates an input beam 210 into a reference beam 106 and a measurement beam 108 that makes four passes through the interferometer. A single mirror 214 is used to reflect the measurement and reference beams after they travel the first and second passes but before the third and fourth passes through the interferometer. The beam splitter 102 combines the reference and measurement beams after they travel the fourth pass through the interferometer to generate an output beam 212. The input beam 210 and output beam 212 will overlap. The input and output beams may be separated any suitable device, such as a beam splitter or an optical circulator.

In the examples shows in FIGS. 2–9, interferometer 55 is a Michelson-type interferometer. Other forms of interferometers, such as those described in an article entitled "Differential interferometer arrangements for distance and angle measurements: Principles, advantages and applications" by C. Zanoni, *VDI Berichte Nr.* 749, 93–106 (1989), the contents of which is incorporated herein by reference, may also be used. For example, the interferometer may be configured to measure changes in positions of objects in multiple axes.

The measurement and reference beam components of the intermediate beam are coextensive beam components (beams 109 and 111 in FIG. 2) with a propagation direction parallel to the propagation direction of the input beam. The intermediate beam is laterally sheared as either the measurement or reference plane mirror is tilted. The magnitudes of the shifts are $4\alpha L_\alpha$ for a rotation of the measurement mirror by an angle $\alpha$ and $4\beta L_\beta$ for a rotation of the reference mirror by an angle $\beta$, where $L_\alpha$ and $L_\beta$ are the one-way physical lengths of the measurement and reference paths, respectively.

In general, the rotation of measurement mirror 112 is about an axis (not shown) perpendicular to the incident plane (the plane that is parallel to the surface of the paper of FIG. 2). The rotation of reference mirror 110 is about another axis (not shown) that is also perpendicular to the incident plane. Rotations of measurement mirror 112 and reference mirror 110 are independent of each other so that addition of the corresponding shears is treated vectorially. Thus, the amount of shear between measurement and reference beams when mirrors 110 and 112 are both misaligned is equal to the amount of beam shear when mirror 110 is aligned with a misaligned mirror 112 plus the amount of beam shear when mirror 110 is misaligned with an aligned mirror 112. The reflector assembly 126 corrects the aggregate shear when both mirrors are tilted.

Reflector assembly 126 is configured so that the shear of return intermediate beams 113 and 115 (FIG. 2) is the same in both magnitude and direction as the shear of intermediate beams 109 and 111. An advantage of this configuration is reduced lateral shear of exit beams 35 so that interference signals measured by detector 40 accurately represent optical path length differences caused by changes in position of measurement mirror 112 when mirror 110 and/or mirror 112 are tilted.

An advantage of the present invention is no lateral shear of the output beam of the interferometer relative to the interferometer as either the measurement or reference object mirrors are tilted.

Another advantage is reduced lateral shear of exit beams 35 at detector 40 when mirror 110 and/or mirror 112 are tilted. This is particularly important when using a fiber optic to transport the output beam to a remote detector.

The correction of shear reduces non-linear non-cyclic errors in detected heterodyne signals.

Interferometry systems 31 and 32 provide highly accurate measurements and are especially useful in lithography applications used in fabricating large scale integrated circuits, for example, computer chips. Lithography is a key technology driver for the semiconductor manufacturing industry. Overlay improvement is one of the five most difficult challenges down to and below 100 nm line widths (design rules), as mentioned in the *Semiconductor Industry Roadmap*, p82 (1997).

Overlay depends directly on the performance, i.e., accuracy and precision, of the distance measuring interferometers used to position wafer and reticle (or mask) stages. Since a lithography tool may produce $50–100M/year of products, the economic value from improved performance distance measuring interferometers is substantial. Each 1% increase in yield of the lithography tool results in approximately $1M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

To properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photo-chemical processes in the resist that convert the radiation pattern into a latent image within the resist.

Interferometry systems are important components of the positioning mechanisms that control the position of the wafer and reticle, and register the reticle image on the wafer. If such interferometry systems include the features described above, the accuracy of distances measured by the systems increases as error contributions to the distance measurement are minimized.

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

Interferometry systems described above can be used to precisely measure the positions of each of the wafer stage and mask stage relative to other components of the exposure system, such as the lens assembly, radiation source, or support structure. In such cases, the interferometry system can be attached to a stationary structure and the measurement object attached to a movable element such as one of the mask and wafer stages. Alternatively, the situation can be reversed, with the interferometry system attached to a movable object and the measurement object attached to a stationary object.

More generally, such interferometry systems can be used to measure the position of any one component of the exposure system relative to any other component of the exposure system, in which the interferometry system is attached to, or supported by, one of the components and the measurement object is attached, or is supported by the other of the components.

Figure 10:
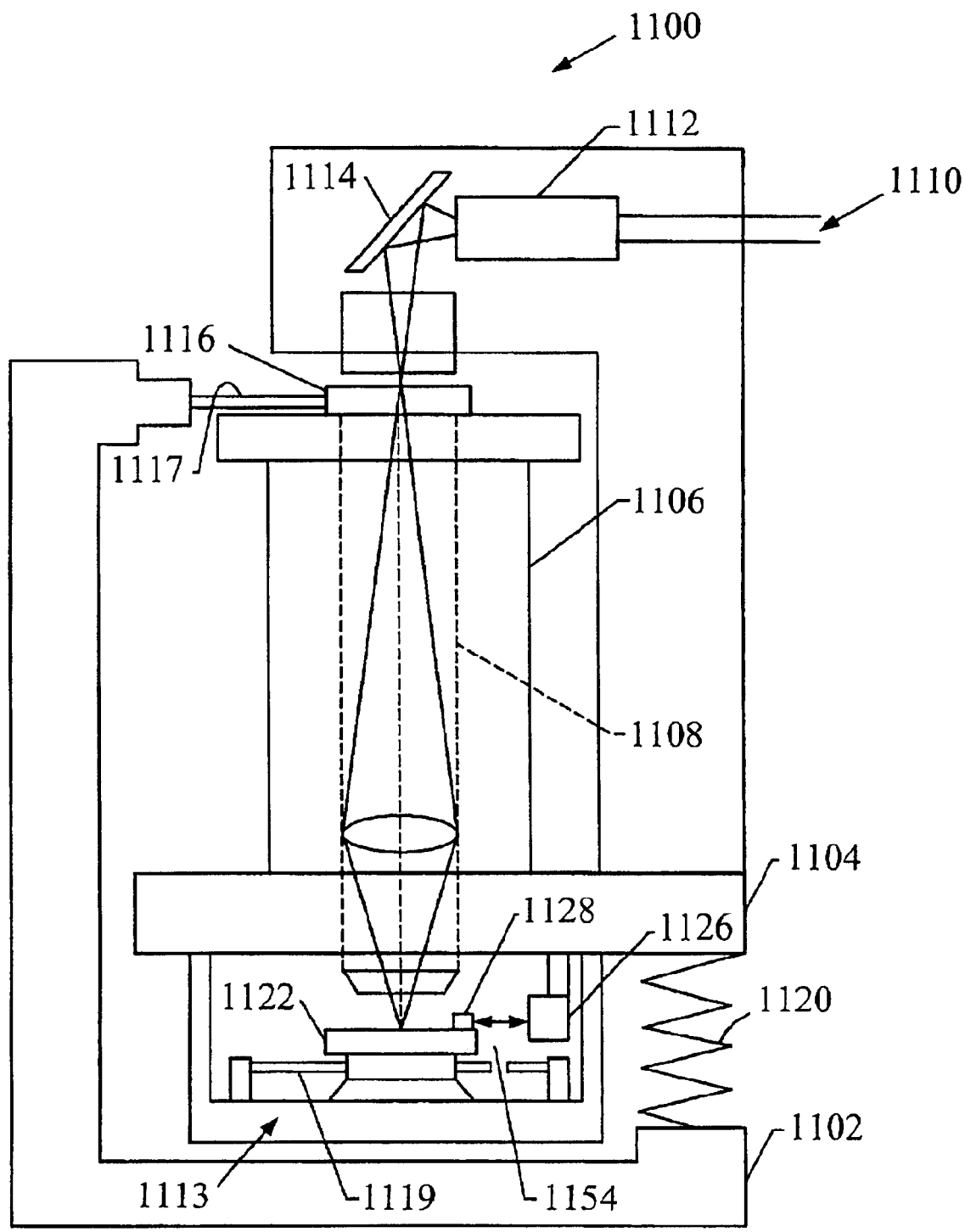
FIG. 10 shows a lithography scanner that includes an interferometry system.

An example of a lithography scanner 1100 using interferometry system 1126 is shown in FIG. 10. Interferometry system 1126 is used to precisely measure the position of a wafer (not shown) within an exposure system. Here, stage 1122 is used to position and support the wafer relative to an exposure station. Scanner 1100 includes a frame 1102, which carries other support structures and various components carried on those structures. An exposure base 1104 has mounted on top of it a lens housing 1106 atop of which is mounted a reticle or mask stage 1116, which is used to support a reticle or mask. A positioning system for positioning the mask relative to the exposure station is indicated schematically by element 1117. Positioning system 1117 can include, e.g., piezoelectric transducer elements and corresponding control electronics.

In another example of a lithography scanner, one or more interferometry systems can also be used to precisely measure the position of mask stage 1116 as well as other moveable elements whose position must be accurately monitored in processes for fabricating lithographic structures.

Suspended below exposure base 1104 is a support base 1113 that carries wafer stage 1122. Stage 1122 includes a plane mirror 1128 for reflecting a measurement beam 1154 directed to stage 1122 by interferometry system 1126. A positioning system for positioning stage 1122 relative to interferometry system 1126 is indicated schematically by element 1119. Positioning system 1119 can include, e.g., piezoelectric transducer elements and corresponding control electronics. The measurement beam reflects back to interferometry system 1126, which is mounted on exposure base 1104. Interferometry system 1126 may include any of the examples of interferometry systems described previously.

During operation, a radiation beam 1110, e.g., an ultraviolet (UV) beam from a UV laser (not shown), passes through a beam shaping optics assembly 1112 and travels downward after reflecting from mirror 1114. Thereafter, the radiation beam passes through a mask (not shown) carried by mask stage 1116. The mask (not shown) is imaged onto a wafer (not shown) on wafer stage 1122 via a lens assembly 1108 carried in a lens housing 1106. Base 1104 and the various components supported by it are isolated from environmental vibrations by a damping system depicted by spring 1120.

In other examples of the lithographic scanner, one or more of the interferometry systems described previously can be used to measure distances along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In some examples, lithographic 1100 scanner can include what is known as a column reference. In such examples, interferometry system 1126 directs the reference beam (not shown) along an external reference path that contacts a reference mirror (not shown) mounted on some structure that directs the radiation beam, e.g., lens housing 1106. The reference mirror reflects the reference beam back to interferometry system 1126. An interference signal is produced by interferometry system 1126 by combining measurement beam 1154 reflected from stage 1122 and the reference beam reflected from a reference mirror mounted on the lens housing 1106. The interference signal indicates changes in the position of stage 1122 relative to the radiation beam. Furthermore, in other examples, interferometry system 1126 can be positioned to measure changes in the position of reticle (or mask) stage 1116 or other movable components of the scanner system. Finally, the interferometry systems can be used in a similar fashion with lithography systems involving steppers, in addition to, or rather than, scanners.

Figure 11:
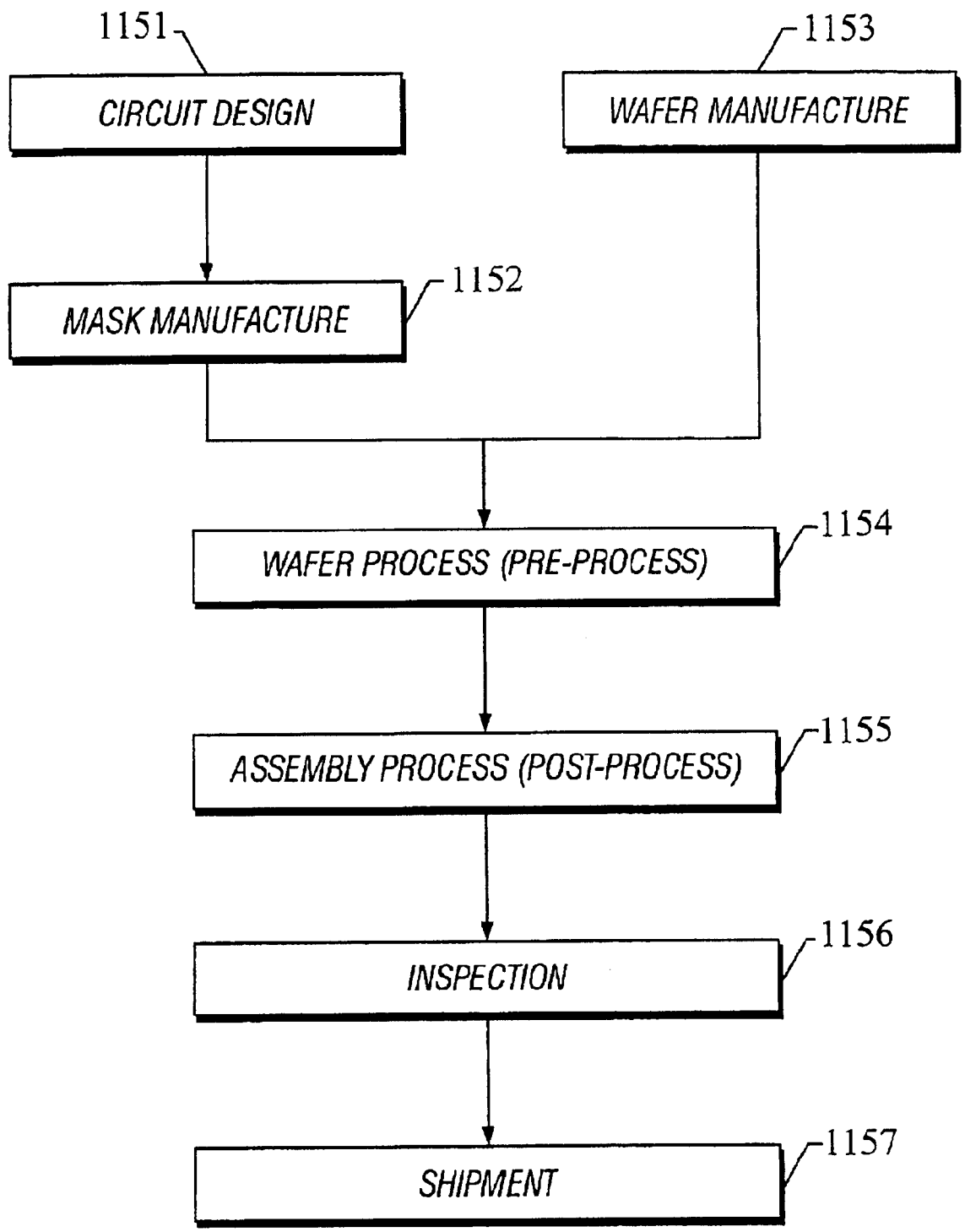
FIGS. 11 and 12 are flow charts that describe steps for making integrated circuits.

Lithography is a critical part of manufacturing methods for making semiconductor devices. For example, U.S. Pat. No. 5,483,343 outlines steps for such manufacturing methods. These steps are described below with reference to FIGS. 11 and 12. FIG. 11 is a flow chart of the sequence of manufacturing a semiconductor device such as a semiconductor chip (e.g., IC or LSI), a liquid crystal panel, or a CCD. Step 1151 is a design process for designing the circuit of a semiconductor device. Step 1152 is a process for manufacturing a mask on the basis of the circuit pattern design. Step 1153 is a process for manufacturing a wafer by using a material such as silicon.

Step 1154 is a wafer process which is called a pre-process wherein, by using the prepared mask and wafer, circuits are formed on the wafer through lithography. To form circuits on the wafer that correspond with sufficient spatial resolution those patterns on the mask, interferometric positioning of the lithography tool relative to the wafer is necessary. The interferometry methods and systems described herein can be especially useful to improve the effectiveness of the lithography used in the wafer process.

Step 1155 is an assembling step, which is called a post-process wherein the wafer processed by step 1154 is formed into semiconductor chips. This step includes assembling (dicing and bonding) and packaging (chip sealing). Step 1156 is an inspection step wherein operability check, durability check and so on of the semiconductor devices produced by step 1155 are carried out. With these processes, semiconductor devices are finished and they are shipped (step 1157).

Figure 12:
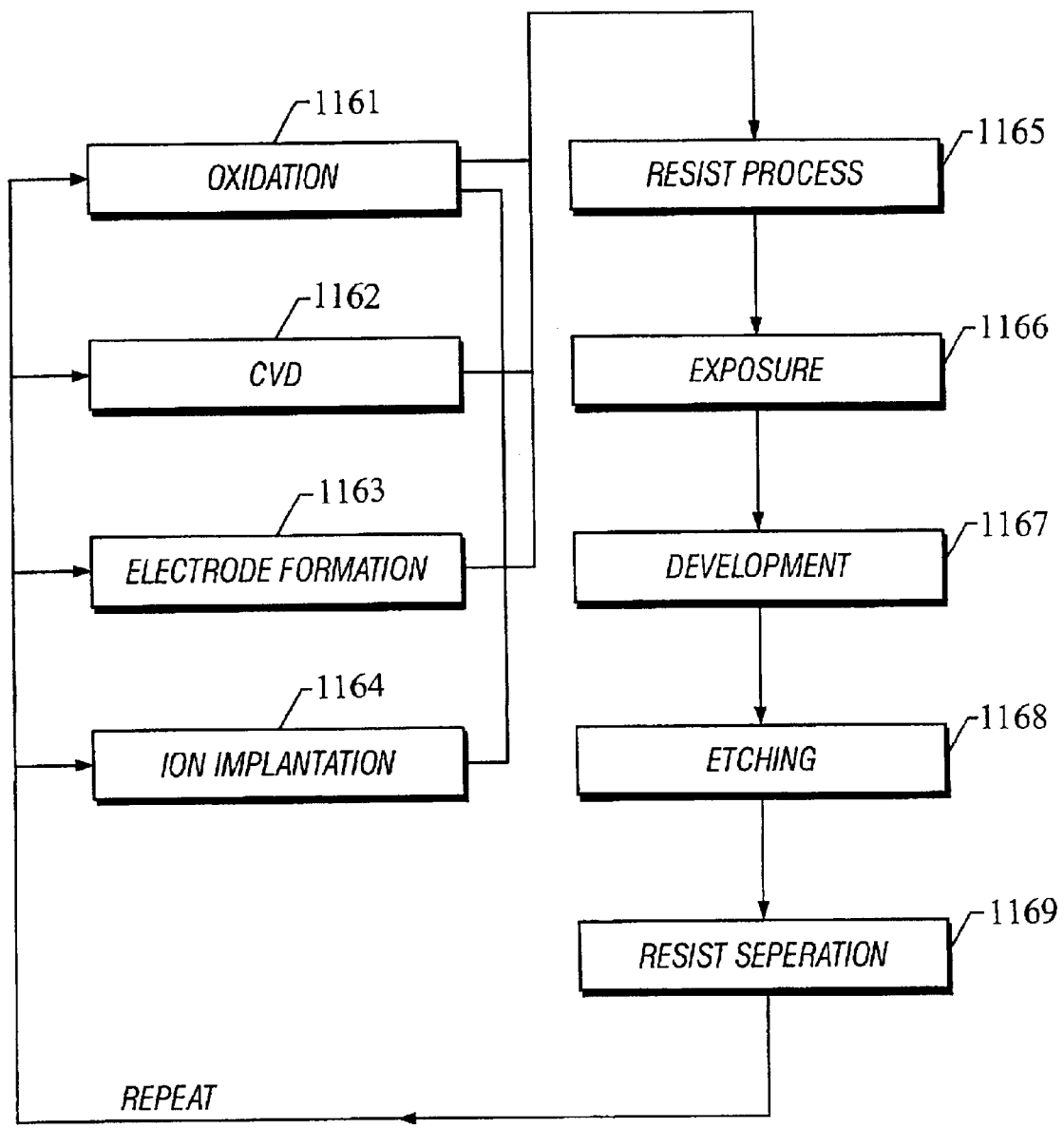

FIG. 12 is a flow chart showing details of the wafer process. Step 1161 is an oxidation process for oxidizing the surface of a wafer. Step 1162 is a CVD process for forming an insulating film on the wafer surface. Step 1163 is an electrode forming process for forming electrodes on the wafer by vapor deposition. Step 1164 is an ion implanting process for implanting ions to the wafer. Step 1165 is a resist process for applying a resist (photosensitive material) to the wafer. Step 1166 is an exposure process for printing, by exposure (i.e., lithography), the circuit pattern of the mask on the wafer through the exposure apparatus described above. Once again, as described above, the use of the interferometry systems and methods described herein improve the accuracy and resolution of such lithography steps.

Step 1167 is a developing process for developing the exposed wafer. Step 1168 is an etching process for removing portions other than the developed resist image. Step 1169 is a resist separation process for separating the resist material remaining on the wafer after being subjected to the etching process. By repeating these processes, circuit patterns are formed and superimposed on the wafer.

The interferometry systems described above can also be used in other applications in which the relative position of an object needs to be measured precisely. For example, in applications in which a write beam such as a laser, x-ray, ion, or electron beam, marks a pattern onto a substrate as either the substrate or beam moves, the interferometry systems can be used to measure the relative movement between the substrate and write beam.

Figure 13:
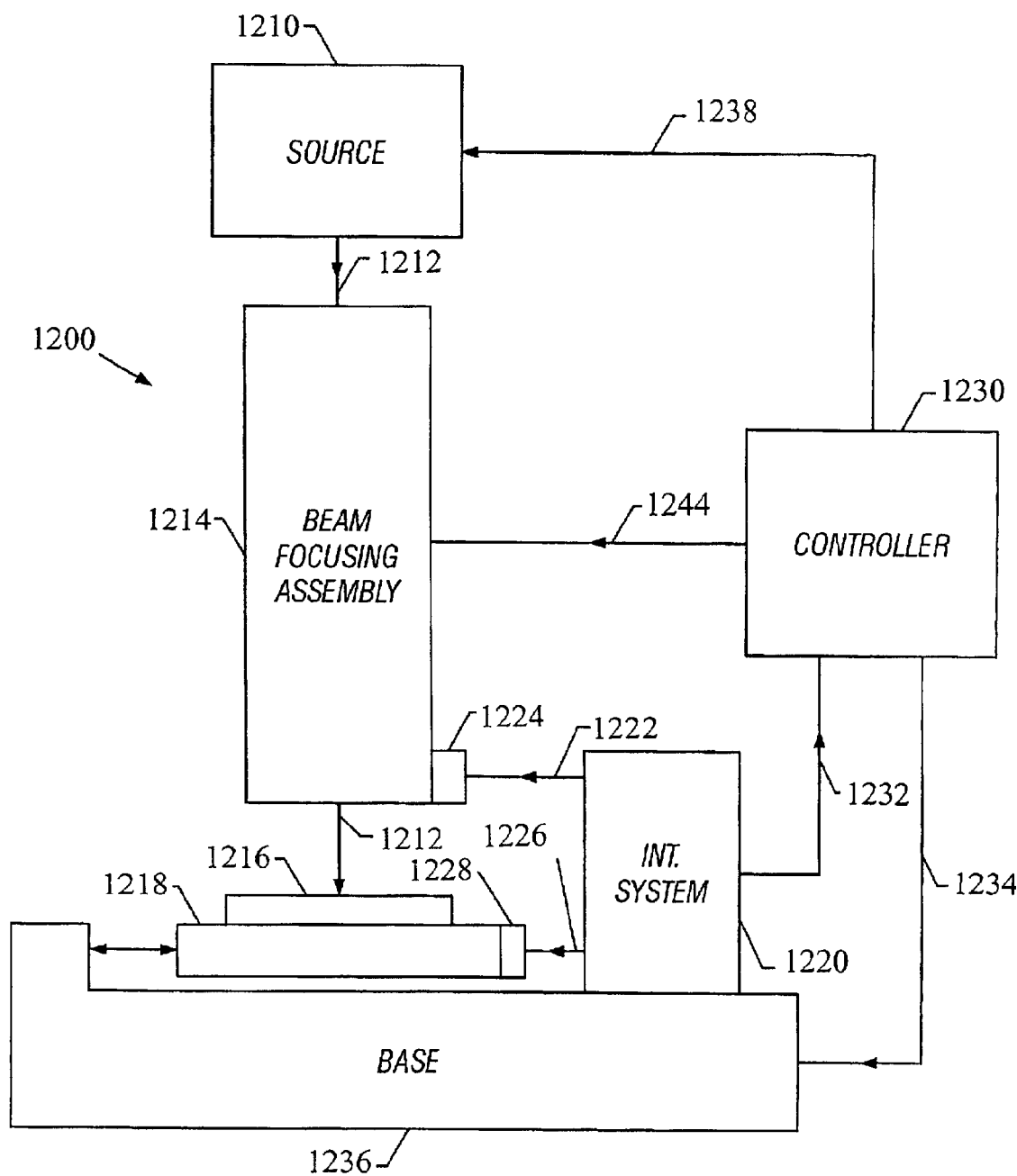
FIG. 13 shows a beam writing system that includes an interferometry system.

Referring to FIG. 13, an example of a beam writing system 1200 includes an interferometry system 1220 that uses a column reference. A source 1210 generates a write beam 1212. A beam focusing assembly 1214 directs the radiation beam to a substrate 1216 supported by a movable stage 1218. To determine the relative position of stage 1218, an interferometry system 1220 directs a reference beam 1222 to a mirror 1224 mounted on beam focusing assembly 1214 and a measurement beam 1226 to a mirror 1228 mounted on stage 1218.

Interferometry system 1220 can be any of the interferometry systems described previously. Changes in the position measured by the interferometry system correspond to changes in the relative position of write beam 1212 on substrate 1216. Interferometry system 1220 sends a measurement signal 1232 to controller 1230 that is indicative of the relative position of write beam 1212 on substrate 1216. Controller 1230 sends an output signal 1234 to a base 1236 that supports and positions stage 1218. In addition, controller 1230 sends a signal 1238 to source 1210 to vary the intensity of, or block, write beam 1212 so that the write beam contacts substrate 1216 with an intensity sufficient to cause photo physical or photochemical change only at selected positions of the substrate.

Furthermore, in some examples, controller 1230 can cause beam focusing assembly 1214 to scan the write beam over a region of the substrate, e.g., using signal 1244. As a result, controller 1230 directs the other components of the system to pattern the substrate. The patterning is typically based on an electronic design pattern stored in the controller. In some applications the write beam patterns a resist coated on the substrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrapole lenses for focusing and directing the charged particles onto the substrate under vacuum. In other cases where the write beam is a radiation beam, e.g., x-ray, UV, or visible radiation, the beam focusing assembly includes corresponding optics and for focusing and directing the radiation to the substrate.

In the interferometry systems described previously, a four-pass interferometer 55 was used. Other types of interferometers that use more than four passes, for example, eight passes, may also be used.

Although some implementations have been described above, other embodiments are also within the scope of the following claims.

For example, the measurement and reference mirrors may be replaced by objects having reflection surfaces, such as crystals having internal reflection surfaces. The mirrors in the reflection assembly may be individual mirrors, or may be a single optical element with multiple reflection surfaces. The polarizing beam splitter may be replaced by a non-polarizing beam splitter.

What is claimed is:

1. Apparatus comprising:
   a multiple-pass interferometer including reflectors to reflect at least two beams along multiple passes through the interferometer, the multiple passes including a first set of passes and a second set of passes, the reflectors having first alignments that are normal to the directions of the paths of the beams that are reflected by the reflectors,
   the paths of the beams being sheared during the first set of passes and during the second set of passes if at least one of the reflectors has an alignment other than the first alignment, and
   optics to redirect the beams after the first set of passes and before the second set of passes so that shear imparted during the second set of passes cancels shear imparted during the first set of passes.

2. The apparatus of claim 1 in which the optics are configured to redirect the beams while maintaining the magnitude and direction of shear between the two beams.

3. The apparatus of claim 1 in which the propagation path of one of the two beams after being redirected by the optics is parallel to the propagation path of the other one of the two beams after completing the first set of passes.

4. The apparatus of claim 1 in which the reflectors comprise plane reflection surfaces.

5. The apparatus of claim 1 in which the beams comprise a reference beam that is directed toward one of the reflectors maintained at a position that is stationary relative to the interferometer.

6. The apparatus of claim 1 in which the beams comprise a measurement beam that is directed towards one of the reflectors that is movable relative to the interferometer.

7. The apparatus of claim 1 in which the paths of the reference and measurement beams define an optical path length difference, the changes in the optical path length difference indicative of changes in the position of the one of the reflectors that is movable relative to the interferometer.

8. The apparatus of claim 1 in which the reflectors comprise a first reflector and a second reflector, the beams comprising a first beam directed toward the first reflector and a second beam directed toward the second reflector, each of the first and second reflectors being movable relative to the interferometer.

9. The apparatus of claim 1 in which the paths of the first and second beams define an optical path length difference, the changes in the optical path length difference indicative of changes in relative positions of the first and second reflectors.

10. The apparatus of claim 1 in which the first set of passes consists of two passes, and during each pass each of the beams is reflected by one of the reflectors at least once.

11. The apparatus of claim 1 in which the second set of passes consists of two passes, and during each pass each of the beams is reflected by one of the reflectors at least once.

12. The apparatus of claim 1 in which the multiple-pass interferometer comprises a beam splitter that separates an input beam into the beams and directs the beams toward the reflectors.

13. The apparatus of claim 1 in which the beam splitter comprises a polarizing beam splitter.

14. The apparatus of claim 1 in which the optics comprise an odd number of reflection surfaces.

15. The apparatus of claim 1 in which normals of the reflection surfaces lie in a common plane.

16. The apparatus of claim 1 in which the reflection surfaces comprise plane reflection surfaces.

17. The apparatus of claim 1 in which for each beam redirected by the optics, the beam is reflected by the reflection surfaces such that a sum of angles between incident and reflection beams of each reflection surface is zero or an integer multiple of 360 degrees, the angle measured in a direction from the incident beam to the reflection beam, the angle having a positive value when measured in a counter clockwise direction and a negative value when measured in a clockwise direction.

18. The apparatus claim 1 in which the interferometer combines the beams after the beams travel through the first and second set of passes to form overlapping beams that exit the interferometer.

19. The apparatus of claim 1 further comprising a detector that responds to optical interference between the overlapping beams and produces an interference signal indicative of an optical path length difference between the paths of the beams.

20. The apparatus of claim 1 in which the detector comprises a photodetector, an amplifier, and an analog-to-digital converter.

21. The apparatus of claim 1 further comprising an analyzer coupled to the detector to estimate a change in an optical path length difference of the beams based on the interference signal.

22. The apparatus of claim 1 in which the optics consist of one reflection surface.

23. The apparatus of claim 1 in which the optics comprise an even number of reflection surfaces.

24. The apparatus of claim 1 in which the optics comprise a cube corner retroreflector.

25. The apparatus of claim 1 further comprising a source to provide the beams.

26. The apparatus of claim 1 in which the interferometer comprises a differential plane mirror interferometer.

27. The apparatus of claim 1 in which the two beams have different frequencies.

28. The apparatus of claim 1 further comprising:
   a stage to support a wafer for fabricating integrated circuits thereon;
   an illumination system to image spatially patterned radiation onto the wafer; and
   a positioning system to adjust the position of the stage relative to the imaged radiation, in which the interferometer is used to measure the position of the stage.

29. The apparatus of claim 1 further comprising:
   a stage to support a wafer for fabricating integrated circuits thereon; and
   an illumination system including a radiation source, a mask, a positioning system, and a lens assembly in which during operation the source directs radiation through the mask to produce spatially patterned radiation, the positioning system adjusts the position of the mask relative to the radiation from the source, the lens assembly images the spatially patterned radiation onto the wafer, and the interferometer is used to measure the position of the mask relative to the wafer.

30. The apparatus of claim 1 further comprising:
a source to provide a write beam to pattern a substrate,
a stage to support the substrate,
a beam directing assembly to deliver the write beam to the substrate, and
a positioning system to position the stage and beam directing assembly relative to one another, in which the interferometer is used to measure the position of the stage relative to the beam directing assembly.

31. Apparatus comprising:
a multiple-pass interferometer including reflectors to reflect at least a first beam along a first path and a second beam along a second path, the first and second paths each including at least a first set of passes and a second set of passes through the interferometer, the reflectors having first alignments that are normal to the directions of the paths of the beams that are reflected by the reflectors,
the relative shear between the paths of the beams changes as the beams make the first and second set of passes through the interferometer when at least one of the reflectors has an alignment other than the first alignment, and
optics to redirect the beams after the first set of passes and before the second set of passes so that shear imparted during the second set of passes cancels shear imparted during the first set of passes.

32. The apparatus of claim 31 in which the first and second paths do not overlap during the first and second set of passes.

33. The apparatus of claim 31 in which the interferometer further comprises a beam splitter to separate an input beam into the first and second beams prior to either of the first and second beams propagate through the first set of passes.

34. The apparatus of claim 33 further comprising a second beam splitter to combine the first and second beams after both of the first and second beams propagate through the second set of passes.

35. The apparatus of claim 31 further comprising a beam splitter that cooperates with the reflectors to reflect the first beam along the first path and the second beam along the second path.

36. The apparatus of claim 35 in which one of the reflectors is disposed between the beam splitter and another one of the reflectors.

37. The apparatus of claim 31 in which the multi-pass interferometer comprises a differential plane mirror interferometer.

38. Apparatus comprising:
a multiple-pass interferometer including reflectors to reflect at least two beams along multiple passes through the interferometer, the multiple passes including a first set of passes and a second set of passes, the reflectors having first alignments,
the shear between the paths of the two beams changes during the first set of passes and during the second set of passes if one of the reflectors moves from the first alignment to a second alignment different from the first alignment, and
optics to redirect the beams after the first set of passes and before the second set of passes so that shear imparted during the second set of passes due to a deviation of one of the reflectors from the first alignment cancels shear imparted during the first set of passes due to the deviation.

39. The apparatus of claim 38 in which the interferometer further includes a polarizing beam splitter to separate an input beam into the at least two beams.

40. The apparatus of claim 38 in which the optics comprise an odd number of reflection surfaces.

41. The apparatus of claim 40 in which the reflection surfaces comprise plane reflections surfaces.

42. A lithography system for fabricating integrated circuits on a wafer, comprising:
a stage to support the wafer;
an illumination system to image spatially patterned radiation onto the wafer; and
a positioning system to adjust the position of the stage relative to the imaged radiation; and
the apparatus of claim 1 to measure the position of the stage along a first degree of freedom.

43. The lithography system of claim 42, further comprising a second one of the apparatus of claim 1 to measure the position of the stage along a second degree of freedom.

44. A lithography system for fabricating integrated circuits on a wafer, comprising:
a stage to support the wafer; and
an illumination system including a radiation source, a mask, a positioning system, a lens assembly, and the apparatus of claim 1 in which during operation the source directs radiation through the mask to produce spatially patterned radiation, the positioning system adjusts the position of the mask relative to the radiation from the source, the lens assembly images the spatially patterned radiation onto the wafer, and the apparatus is used to measure the position of the mask relative to the wafer along a first degree of freedom.

45. The lithography system of claim 44 further comprising a second one of the apparatus of claim 1 to measure the position of the stage along a second degree of freedom.

46. A beam writing system, comprising:
a source to provide a write beam to pattern a substrate,
a stage to support the substrate,
a beam directing assembly to deliver the write beam to the substrate, and
a positioning system to position the stage and beam directing assembly relative one another; and
the apparatus of claim 1 to measure the position of the stage relative to the beam directing assembly along a first degree of freedom.

47. The beam writing system of claim 46 further comprising a second one of the apparatus of claim 1 to measure the position of the stage along a second degree of freedom.

48. A method comprising:
directing at least two beams along multiple passes through an interferometer, the multiple passes including a first set of passes and a second set of passes, the reflectors having first alignments that are normal to the directions of the paths of the beams that are reflected by the reflectors, and
causing shear that is imparted in the first set of passes to be cancelled by shear imparted in the second set of passes by redirecting the beams after the first set of passes and before the second set of passes.

49. The method of claim 48 in which redirecting the beams after the first set of passes comprises using an odd number of reflection surfaces to redirect the beams.

50. The method of claim 48 in which redirecting the beams after the first set of passes consists of using one reflection surface to redirect the beams.

51. The method of claim 48 in which redirecting the beams after the first set of passes comprises redirecting the beams so that the beams after being redirected travel in directions opposite but parallel to the propagation directions of the beams before being redirected.

52. The method of claim 48 in which redirecting the beams after the first set of passes comprises redirecting the beams so that the magnitude and direction of shear of the beams after being redirected are the same as the magnitude and direction of shear of the beams before being redirected.

53. The method of claim 48 further comprising separating an input beam into the at least two beams.

54. The method of claim 48 further comprising combining the beams after the multiple passes through the interferometer to form overlapping beams.

55. The method of claim 54 further comprising detecting interference signals from the overlapping beams.

56. The method of claim 55 further comprising estimating a change in the optical path length of one of the beams based on the interference signals.

57. The method of claim 55 further comprising estimating a change in the optical path length difference between two of the at least two beams based on the interference signals.

58. The method of claim 48 in which the two beams have different frequencies.

59. The method of claim 48 further comprising:
supporting a wafer on a stage;
imaging spatially patterned radiation onto the wafer;
adjusting the position of the stage relative to the imaged radiation; and
measuring the relative position of the stage using the beams that exit the interferometer after the multiple passes.

60. The method of claim 48 further comprising:
supporting a wafer on a stage;
directing radiation from a source through a mask to produce spatially patterned radiation;
positioning the mask relative to the wafer;
measuring the position of the mask relative to the wafer using the beams that exit the interferometer after the multiple passes; and
imaging the spatially patterned radiation onto the wafer.

61. The method of claim 48 further comprising:
providing a write beam to pattern a substrate;
supporting the substrate on a stage;
delivering the write beam to the substrate;
positioning the stage relative to the write beam; and
measuring the relative position of the stage using the beams that exit the interferometer after the multiple passes.

62. A method comprising:
directing at least two beams along multiple passes through an interferometer, the multiple passes including a first set of passes and a second set of passes, the reflectors having first alignments, and
redirecting the two beams after the first set of passes and before the second set of passes to cause shear that is imparted in the first set of passes caused by one of the reflectors moving from the first alignment to a second alignment to be cancelled by shear imparted in the second set of passes caused by the movement of the reflector from the first alignment to the second alignment.

63. The method of claim 62 further comprising separating an input beam into the at least two beams.

64. The method of claim 63 further comprising overlapping the two beams after the second set of passes.

65. A lithography method for fabricating integrated circuits on a wafer, comprising:
supporting the wafer on a stage;
imaging spatially patterned radiation onto the wafer;
adjusting the position of the stage relative to the imaged radiation; and
measuring the relative position of the stage along a first degree of freedom using the method of claim 48.

66. The lithography method of claim 65 further comprising using the method of claim 48 to measure the relative position of the stage along a second degree of freedom.

67. A lithography method for fabricating integrated circuits on a wafer, comprising:
supporting the wafer on a stage;
directing radiation from a source through a mask to produce spatially patterned radiation;
positioning the mask relative to the wafer;
measuring the position of the mask relative to the wafer along a first degree of freedom using the method of claim 48; and
imaging the spatially patterned radiation onto the wafer.

68. The lithography method of claim 67 further comprising using the method of claim 48 to measure the relative position of the mask along a second degree of freedom.

69. A lithography method for fabricating a photolithography mask, comprising:
providing a write beam to pattern a substrate;
supporting the substrate on a stage;
delivering the write beam to the substrate;
positioning the stage relative to the write beam; and
measuring the relative position of the stage along a first degree of freedom using the method of claim 48.

70. The lithography method of claim 69 further comprising using the method of claim 48 to measure the relative position of the stage along a second degree of freedom.

* * * * *